United States Patent
Nishida et al.

(10) Patent No.: US 9,094,045 B2
(45) Date of Patent: Jul. 28, 2015

(54) TRANSMISSION SYSTEM AND ERROR CORRECTION CONTROL METHOD

(75) Inventors: Hiroshi Nishida, Kawasaki (JP); Hideaki Tazawa, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 313 days.

(21) Appl. No.: 13/483,611

(22) Filed: May 30, 2012

(65) Prior Publication Data

US 2013/0007553 A1    Jan. 3, 2013

(30) Foreign Application Priority Data

Jun. 30, 2011    (JP) ................................ 2011-146021

(51) Int. Cl.
*H03M 13/00* (2006.01)
*H03M 13/15* (2006.01)
*H04L 1/00* (2006.01)
*H03M 13/35* (2006.01)

(52) U.S. Cl.
CPC ........ *H03M 13/1515* (2013.01); *H03M 13/353* (2013.01); *H04L 1/0009* (2013.01); *H04L 1/0025* (2013.01)

(58) Field of Classification Search
CPC ..... H04L 7/048; H04L 1/0057; H04L 1/0041; H03M 13/33; G11B 20/1833
USPC ....................................................... 714/775
See application file for complete search history.

(56) References Cited

U.S. PATENT DOCUMENTS 4,975,915 A * 12/1990 Sako et al. ..................... 714/755
5,031,179 A * 7/1991 Yoshida et al. ............... 714/748
5,721,417 A * 2/1998 Craig ....................... 219/137.43
5,839,077 A 11/1998 Kowaguchi
2010/0027988 A1 2/2010 Hoshida et al.
2010/0080245 A1 * 4/2010 Kisaka et al. ................. 370/470

FOREIGN PATENT DOCUMENTS

JP    9-116486    5/1997
JP    2000-216758  8/2000
JP    2004-015172  1/2004
JP    2010-41108   2/2010

OTHER PUBLICATIONS

Japanese Notification of Reason for Refusal issued Jan. 20, 2015 in Japanese Application No. 2011-146021.

* cited by examiner

*Primary Examiner* — Albert DeCady
*Assistant Examiner* — Enam Ahmed
(74) *Attorney, Agent, or Firm* — Staas & Halsey LLP

(57) ABSTRACT

There is provided an error correction control method of a transmission system on which a signal is transmitted from a first transmission apparatus to a second transmission apparatus, the error correction control method including: transmitting a signal for a mode change request to change an error correction mode from the second transmission apparatus to the first transmission apparatus; transmitting signals having a change timing value in a specific order with a specific period from the first transmission apparatus to the second transmission apparatus when the first transmission apparatus receives the mode change request; changing the error correction mode of the first transmission apparatus when the change timing value to be transmitted becomes a specific value in the first transmission apparatus; and changing the error correction mode of the second transmission apparatus in response to the change timing value received with the specific period from the first transmission apparatus.

16 Claims, 18 Drawing Sheets

FIG. 2

| ROW \ COLUMN | 1 | 2 | 3 | 4 | 5 | 6 | 7 | 8 | 9 | 10 | 11 | 12 | 13 | 14 | 15 | 16 | 17 | ... | 3824 | 3825 | ... | 4080 |
|---|---|---|---|---|---|---|---|---|---|---|---|---|---|---|---|---|---|---|---|---|---|---|
| 1 | FAS | | | | | | MFAS | SM | | | GCC0 | | RES | | OPU OVERHEAD | | OPUk PAYLOAD | | | OTUk FEC | | |
| 2 | RES | | | TCM ACT | TCM6 | | | TCM5 | | | TCM4 | | | FTFL | | | | | | | | |
| 3 | TCM3 | | | TCM2 | | | TCM1 | | | | PM | | | EXP | | | | | | | | |
| 4 | GCC1 | | | GCC2 | | | APC/PCC | | | | RES | | | | | | | | | | | |

| FAULT INDICATION CODE | DEFINITION |
|---|---|
| 0000 0000 | NO FAULT |
| 0000 0001 | SIGNAL FAIL |
| 0000 0010 | SIGNAL DEGRADE |
| 0000 0011<br>.<br>.<br>.<br>1111 1111 | RESERVED FOR FUTURE INTERNATIONAL STADARDIZATION |

TRANSMISSION SYSTEM AND ERROR CORRECTION CONTROL METHOD

CROSS-REFERENCE TO RELATED APPLICATION

This application is based upon and claims the benefit of priority of the prior Japanese Patent Application No. 2011-146021, filed on Jun. 30, 2011, the entire contents of which are incorporated herein by reference.

FIELD

The embodiment discussed herein is related to a transmission system and an error correction control method.

BACKGROUND

Error correction code is typically used as a technique of supporting high-speed information communications, communications using long-distance communication lines, or a combination thereof. The error correction code is used to correct a bit error in a signal received by a receiver.

A technique of correcting a transmission error using forward error correction (FEC) is standardized in an optical transport network (OTN) widely used in the field of optical transmission networks. For example, RS-FEC is standardized in International Telecommunication Union (ITU)-T G. 709 standard. Super FEC higher in error correction capability than RS-FEC is standardized in ITU-T G. 975.1 standard.

More complex arithmetic calculation is to be used to increase the error correction capability. An error corrector may be implemented using a circuit module such as large scale integration (LSI). To increase the error correction capability, a circuit scale of the circuit module is enlarged, and power consumption involved is likely to increase.

Techniques described below are disclosed as related art. In a large-zone radio transmission system including relay stations, mobile stations, and fixed stations, each station includes an error correction unit featuring a plurality of error correction methods. An error correction method is selected with a view to a line quality of radio transmission line. When the line quality is degraded, the error correction method is switched from one method to another. The error correction method providing a minimum error ratio is selected in response to the line quality. The radio transmission having a high line quality is established without reducing transmission efficiency. Such a technique is discussed in Japanese Laid-open Patent Publication No. 9-116486. Techniques related to the error correction are also discussed in Japanese Laid-open Patent Publication Nos. 2004-15172 and 2010-41108.

SUMMARY

According to an aspect of the embodiment, there is provided an error correction control method of a transmission system on which a signal is transmitted from a first transmission apparatus to a second transmission apparatus, the error correction control method including: transmitting a signal for a mode change request to change an error correction mode from the second transmission apparatus to the first transmission apparatus; transmitting signals having a change timing value in a specific order with a specific period from the first transmission apparatus to the second transmission apparatus when the first transmission apparatus receives the mode change request; changing the error correction mode of the first transmission apparatus when the change timing value to be transmitted becomes a specific value in the first transmission apparatus; and changing the error correction mode of the second transmission apparatus in response to the change timing value received with the specific period from the first transmission apparatus.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 illustrates a frame structure of an optical transport network (OTN);

DESCRIPTION OF EMBODIMENTS

To control the effect of bit errors, high performance error correction is desirable. In a long-distance transmission system, the highest performance error correction method is typically permanently set in view of a variety of factors including a temperature change. There is a tradeoff between the error correction performance and power consumption. In related art, the typical transmission system excessively consumes power for the error correction.

Such a problem may be solved by changing the error correction method in response to the quality of the transmission line. To change the error correction method, however, the process related to the error correction method is changed in each of a transmitter and a receiver. If the error correction method is changed in response to an instruction of a network operator, it is difficult for the transmitter and the receiver to change the process thereof in synchronization. If the transmitter and the receiver are not synchronized in the switching timing of the error correction process, the receiver may temporarily have a difficulty in reproducing a communication signal (such as a data signal).

If instruction information exchanged between the transmitter and the receiver to change the error correction method is not properly transmitted, the transmitter and the receiver may operate in mutually different error correction methods. In such a case, as well, the receiver has a difficulty in reproducing the communication signal in the changing of the error correction method.

Figure 1:
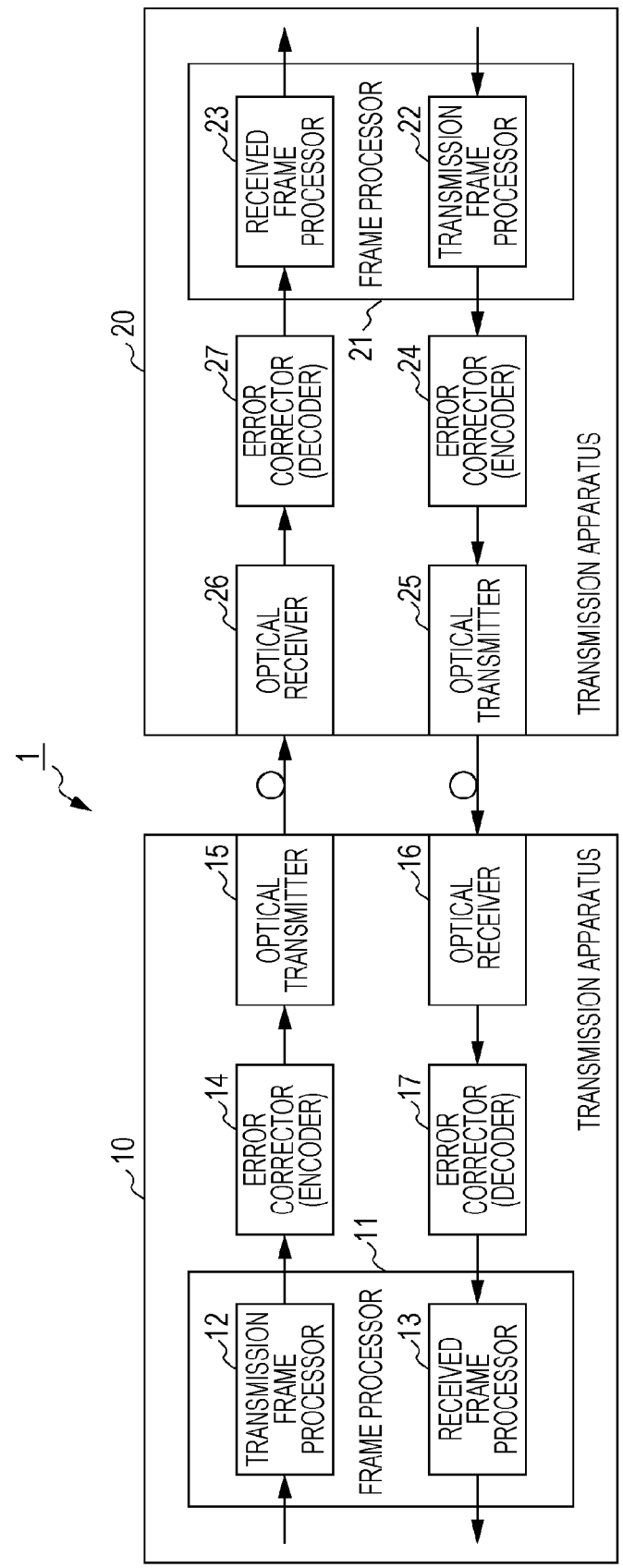
FIG. 1 illustrates a configuration example of a transmission system of an embodiment.

FIG. 1 illustrates a configuration example of a transmission system 1 of one embodiment. As illustrated in FIG. 1, the transmission system 1 transmits a signal between a transmission apparatus 10 and a transmission apparatus 20. In the discussion that follows, the transmission system 1 transmits a signal that complies with OTN scheme standardized in ITU-T.

FIG. 2 illustrates a frame structure of OTN. The OTN frame includes client data in a payload (optical channel payload unit-k (OPUk) payload). An OPU frame is generated by attaching an OPU overhead to the payload. An ODU frame is generated by attaching an optical channel data unit-k (ODUk) overhead to the OPU frame. The ODUk overhead includes TCMACT, TCM6-TCM4, FTFL, TCM3-TCM1, PM, EXP, GCC1-GCC2, and APC/PCC. The OTN frame is generated by attaching to the ODU frame the optical channel transport unit-k (OTUk) overhead and an OTUk error correction code (OTUk FEC). The OTUk overhead includes SM and GCC0. The OTN frame may not include the OTUk error correction code. The OTN frame structure is not discussed in detail here.

The transmission apparatus 10 includes frame processor 11, error corrector 14, optical transmitter 15, optical receiver 16, and error corrector 17. The frame processor 11 includes transmission frame processor 12 and received frame processor 13.

The transmission frame processor 12 generates a frame by adding to client data the OPU overhead, the ODUk overhead, and the OTUk overhead. As appropriate, the error corrector 14 generates and attaches an error correction code to the frame output from the transmission frame processor 12. More specifically, the error corrector 14 serves as an encoder of the error correction code. The optical transmitter 15 converts the OTN frame output from the error corrector 14 into an optical signal and then transmits the optical signal. The optical signal is transmitted via an optical transmission line and then received by the transmission apparatus 20.

The optical receiver 16 receives an optical signal transmitted from the transmission apparatus 20. As the transmission apparatus 10, the transmission apparatus 20 transmits an OTN frame. The error corrector 17 performs an error correction process on a received frame signal. More specifically, the error corrector 17 serves as a decoder of the error correction code. The received frame processor 13 references the overhead of the received frame to perform a frame process, and then extracts client data transmitted from the transmission apparatus 20.

The transmission apparatus 20 includes frame processor 21, error corrector 24, optical transmitter 25, optical receiver 26, and error corrector 27. The frame processor 21 includes transmission frame processor 22 and received frame processor 23. The transmission apparatus 20 is identical in structure and operation to the transmission apparatus 10, and the discussion thereof is omitted herein.

Figure 3:
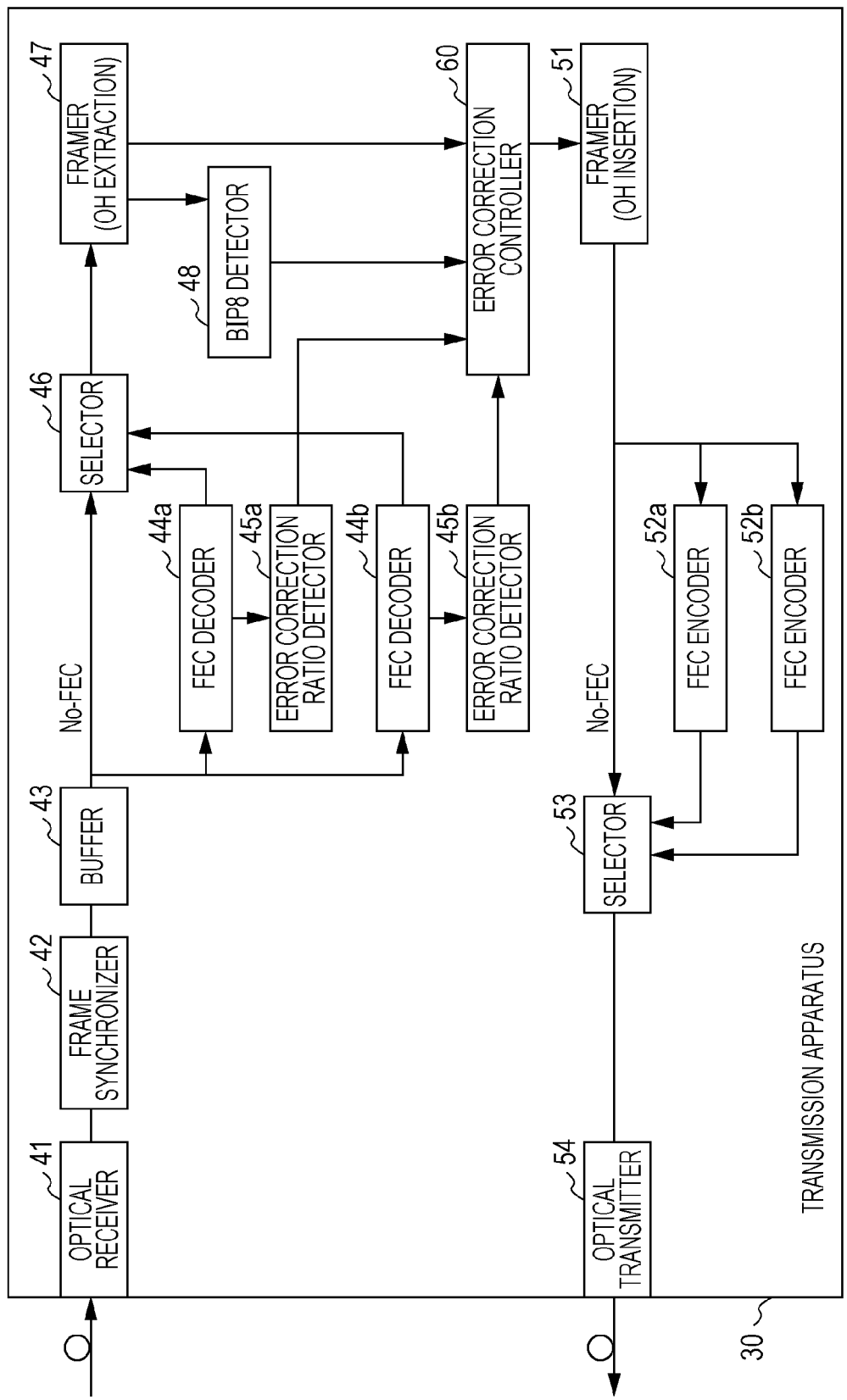
FIG. 3 is a block diagram of a transmission apparatus of the embodiment.

FIG. 3 is a block diagram of a transmission apparatus 30 of the embodiment. The transmission line apparatus 30 of FIG. 3 corresponds to each of the transmission apparatus 10 and the transmission apparatus 20 illustrated in FIG. 1. The transmission apparatus 30 of the embodiment includes, as a receiver circuit, optical receiver 41, frame synchronizer 42, buffer 43, FEC decoders 44a and 44b, error correction ratio detectors 45a and 45b, selector 46, framer 47, and BIP8 detector 48. The transmission apparatus 30 includes, as a transmitter circuit, framer 51, FEC encoders 52a and 52b, selector 53, and optical transmitter 54. The transmission apparatus 30 further includes an error correction controller 60.

If the transmission apparatus 30 operates as the transmission apparatus 10 of FIG. 1, the optical receiver 41 corresponds to the optical receiver 16. The FEC decoders 44a and 44b and the selector 46 are included in the error corrector 17. The framer 47 corresponds to the received frame processor 13. The framer 51 corresponds to the transmission frame processor 12. The FEC encoders 52a and 52b and the selector 53 are included in the error corrector 14. The optical transmitter 54 corresponds to the optical transmitter 15.

The optical receiver 41 receives an optical signal transmitted from a transmission apparatus (hereinafter also referred to as a partner transmission apparatus) facing the transmission apparatus 30. The optical signal conveys the OTN frame. The optical receiver 41 converts the received optical signal into an electrical signal, and then outputs the electrical signal. The frame synchronizer 42 detects a specific signal pattern in the electrical signal output from the optical receiver 41, thereby establishing frame synchronization. More specifically, the OTN frames are extracted in order from the electrical signal.

The buffer 43 temporarily stores the OTN frame received from the partner transmission apparatus in order. The OTN frames output in order from the buffer 43 are transferred to the selector 46, and the FEC decoders 44a and 44b. The FEC decoders 44a and 44b error-correct each OTN frame through mutually different methods. For example, the FEC decoder 44a error-corrects each OTN frame through RS-FEC defined by ITU-T G. 709. The FEC decoder 44b error-corrects each OTN frame through Super FEC defined in ITU-T G. 975.1. It is noted that the error correction performance of Super FEC is higher than the error correction performance of RS-FEC. However, the error correction through Super FEC consumes more power than the error correction through RS-FEC. The OTN frames error-corrected by the FEC decoders 44a and 44b are supplied to the selector 46. The buffer 43 operates to absorb a difference in latency caused through three paths from the buffer 43 to the selector 46.

The selector 46 selects one signal from the output signal of the buffer 43, the output signal of the FEC decoder 44a, and the output signal of the FEC decoder 44b in response to a mode instruction signal provided by the error correction controller 60. The error correction controller 60 generates the mode instruction signal specifying as the error correction mode a no-error-correction mode (mode 0), an error correction through RS-FEC (mode 1), and an error correction through Super FEC (mode 2). In the example of the embodiment, the error correction modes include the no-error-correction mode. Optionally, the error correction modes may not include the no-error-correction mode.

If the mode instruction signal specifying the mode 0 is provided, the selector 46 selects the output signal of the buffer 43 (the OTN frame with no error correction performed thereon). If the mode instruction signal specifying the mode 1 is provided, the selector 46 selects the output signal of the FEC decoder 44a (the OTN frame with the error correction performed thereon through RS-FEC). If the mode instruction signal specifying the mode 2 is provided, the selector 46 selects the output signal of the FEC decoder 44b (the OTN frame with the error correction performed thereon through Super FEC).

When the mode instruction signal specifies the mode 0, the operations of the FEC decoders 44a and 44b may be suspended. When the mode instruction signal specifies the mode 1, the operation of the FEC decoder 44b may be suspended. When the mode instruction signal specifies the mode 2, the operation of the FEC decoder 44a may be suspended.

The framer 47 performs a specific frame process by referencing the overhead of the OTN frame output from the selector 46. The framer 47 then extracts client data from the payload region of the OTN frame, and then outputs the client data. The framer 47 also extracts information related to error correction control from the overhead of the OTN frame, and then supplies the information to the error correction controller 60.

The error correction ratio detector 45a counts the bit errors corrected by the FEC decoder 44a, and then calculates an error correction ratio. The error correction ratio detector 45b counts the bit errors corrected by the FEC decoder 44b, and then calculates an error correction ratio. The FEC decoders 44a and 44b output a signal representing the number of corrected bit errors each time each frame is processed thereby. The error correction ratio detectors 45a and 45b notify the error correction controller 60 of the bit error correction ratios calculated thereby.

The bit interleaved parity-8 (BIP8) detector 48 detects an error ratio by performing a parity check on the output signal of the selector 46. Optionally, the BIP8 detector 48 may calculate the error ratio only when the FEC decoders 44a and 44b do not perform the error correction. The BIP8 detector 48 notifies the error correction controller 60 of the error ratio calculated thereby.

The framer 51 generates a frame by attaching the overhead to the client data to be transmitted to the partner transmission apparatus. The overhead here may include information related to the error correction control. The error correction controller 60 may provide the information related to the error correction control.

The frame generated by the framer 51 is supplied to the selector 53, and the FEC encoders 52a and 52b. The FEC encoders 52a and 52b attach an error correction code to each frame in methods corresponding to the methods of the FEC decoders 44a and 44b. More specifically, the FEC encoder 52a attaches the error correction code to each frame through RS-FEC defined in ITU-T G. 709. The FEC encoder 52b attaches the error correction code to each frame through Super FEC defined in ITU-T G. 975.1. The frames with the error correction code attached thereto by the FEC encoders 52a and 52b are supplied to the selector 53.

The selector 53 selects one of the output signal of the framer 51, the output signal of the FEC encoder 52a, and the output signal of the FEC encoder 52b in response to a mode instruction signal from the error correction controller 60. If the mode instruction signal indicating the mode 0 is provided, the selector 53 selects the output signal of the framer 51 (i.e., the OTN frame with no error correction code attached thereto). If the mode instruction signal indicating the mode 1 is provided, the selector 53 selects the output signal of the FEC encoder 52a (i.e., the OTN frame with the error correction code attached thereto through RS-FEC). If the mode instruction signal indicating the mode 2 is provided, the selector 53 selects the output signal of the FEC encoder 52b (i.e., the OTN frame with the error correction code attached thereto through Super FEC).

When the mode instruction signal specifies the mode 0, the operation of the FEC encoders 52a and 52b may be suspended. When the mode instruction signal specifies the mode 1, the operation of the FEC encoder 52b may be suspended. When the mode instruction signal specifies the mode 2, the operation of the FEC encoder 52a may be suspended.

The mode instruction signal supplied to the selector 46 and the mode instruction signal supplied to the selector 53 are independent of each other. The mode instruction signal supplied to the selector 46 specifies the error correction mode applied to the signal transmission from the partner transmission apparatus to the transmission apparatus 30. The mode instruction signal supplied to the selector 53 specifies the error correction mode applied to the signal transmission from the transmission apparatus 30 to the partner transmission apparatus. The optical transmitter 54 includes an optical modulator, and generates an optical signal that conveys the output signal of the selector 53. The optical signal is transmitted to the partner transmission apparatus.

The error correction controller 60 references the error ratio provided by the error correction ratio detectors 45a and 45b or the error ratio provided by the BIP8 detector 48 to determine whether to change the error correction mode. As described above, the transmission system 1 provides as the error correction modes "0: no error correction (No-FEC)," "1: RS-FEC," and "2: Super FEC." As described below, the error correction controller 60 determines whether to change the error correction mode.

(1) If the mode 2 (Super FEC) is in use: (1a) the error correction controller 60 changes to the mode 1 with the error ratio lower than $5 \times 10^{-5}$; (1b) otherwise, the mode 2 is maintained.

(2) If the mode 1 (RS-FEC) is in use: (2a) the error correction controller 60 changes to the mode 2 with the error correction ratio higher than $5 \times 10^{-5}$; (2b) the error correction controller 60 changes to the mode 0 if the mode 1 (RS-FEC) is in use with the error correction ratio lower than $1 \times 10^{-15}$; (2c) otherwise, the mode 1 is maintained.

(3) If the mode 0 (without error correction) is in use: (3a) the error correction controller 60 changes to the mode 1 with the error correction ratio higher than $1 \times 10^{-15}$; (3b); otherwise, the mode 0 is maintained. The specific threshold values ($5 \times 10^{-15}$ and $1 \times 10^{-15}$) are based on code gain described in ITU-T G. 709/G. 975.1.

Figure 4:
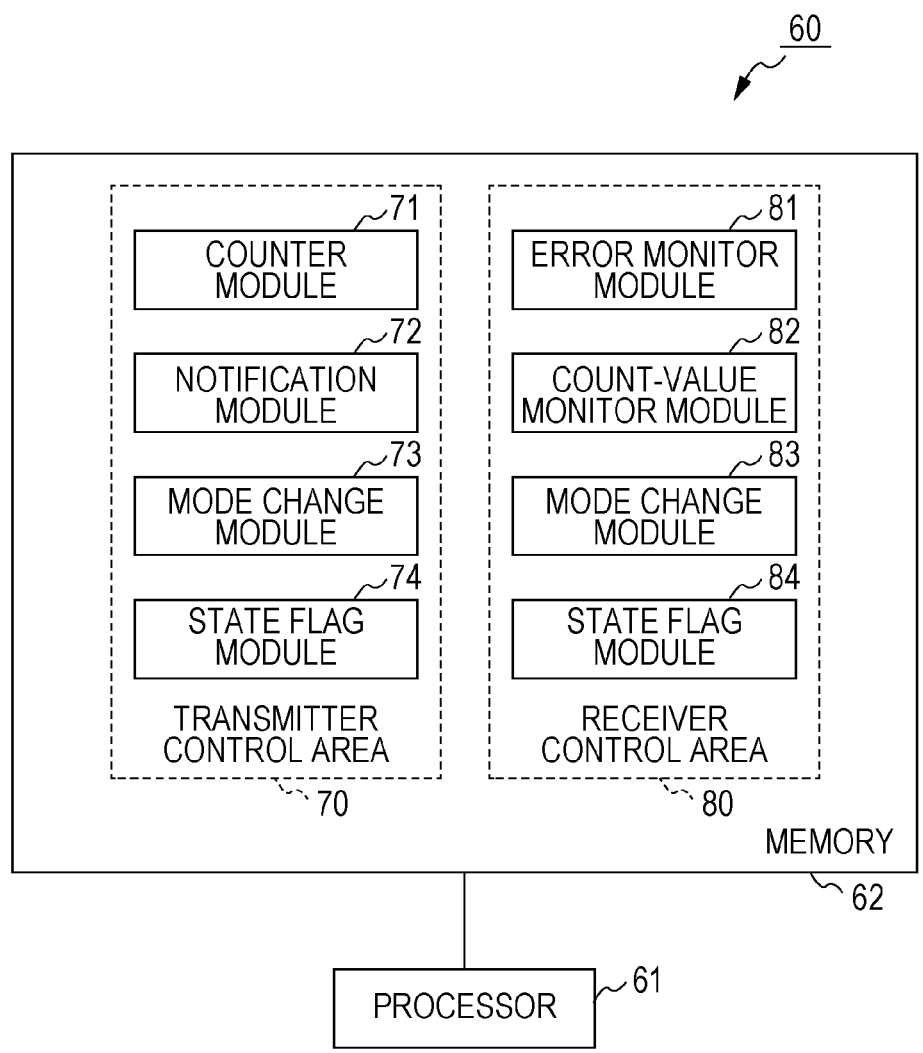
FIG. 4 is a functional block diagram of an error correction controller.

FIG. 4 illustrates a structure and a function of the error correction controller 60. The error correction controller 60 includes a processor 61 and a memory 62. The memory 62 is a semiconductor memory, for example. The memory 62 includes a transmitter control area 70 and a receiver control area 80.

The transmitter control area 70 stores information and a program, related to the error correction process, and causing the transmission apparatus 30 to operate as a transmitter. More specifically, the error correction controller 60 includes counter module 71, notification module 72, mode change module 73, and state flag module 74.

When the error correction controller 60 receives the mode change request from the partner transmission apparatus, the counter module 71 starts a counting operation. The counter module 71 decrements the count value thereof by one with a specific period. Optionally, the counter module 71 may increment the count value thereof by one with the specific period. The mode change request includes information requesting the error correction mode to be changed, and information representing the error correction mode as a change target (target mode).

The notification module 72 transmits the count value of the counter module 71 to the partner transmission apparatus. For example, the notification module 72 transmits the count value to the partner transmission apparatus each time the counter module 71 updates the count value thereof.

When the counter module 71 reaches a specific count value, the mode change module 73 changes the mode from the current error correction mode to the error correction mode specified by the mode change request (i.e., the target mode). For example, the counter module 71 may now decrement a specific initial value. When the counter module 71 reaches a count value of zero, the mode change module 73 changes the error correction mode. The change of the error correction mode of the mode change module 73 is carried out by an operation of providing the mode instruction signal to the selector 53 and an operation of starting up the FEC encoder (52a or 52b) corresponding to the target mode.

If the mode instruction signal received from the partner transmission apparatus specifies "0: no error correction," the mode change module 73 causes the selector 53 to select the output signal of the framer 51. If the mode instruction signal received from the partner transmission apparatus specifies "1: RS-FEC," the mode change module 73 starts up the FEC encoder 52a and then causes the selector 53 to select the output signal of the FEC encoder 52a. If the mode instruction signal received from the partner transmission apparatus specifies "2: Super FEC," the mode change module 73 starts up the FEC encoder 52b and then causes the selector 53 to select the output signal of the FEC encoder 52b.

The state flag module 74 indicates an operational state of the transmitter within the transmission apparatus 30. In the example here, "1" indicates a state in which an operation of changing the error correction mode is being performed on the transmitter, and "0" indicates a state in which an operation of changing the error correction mode is not being performed on the transmitter.

The receiver control area 80 stores information and a program, related to the error correction process, and causing the transmission apparatus 30 to operate as a receiver. The error correction controller 60 includes error monitor module 81, count-value monitor module 82, mode change module 83, and stage flag module 84.

The error monitor module 81 references the error correction ratio provided by the error correction ratio detectors 45a and 45b, and the error ratio provided by the BIP8 detector 48, and then determines whether to change the error correction mode. If the transmission system 1 operates in the "mode 2: Super FEC" with the error correction ratio lower than $5\times10^{-5}$, the error monitor module 81 determines that the "mode 2: Super FEC" is to be changed to the "mode 1: RS-FEC." If the transmission system 1 operates in the "mode 2: Super FEC" with the error correction ratio equal to or higher than $5\times10^{-5}$, the error monitor module 81 determines that the "mode 2: Super FEC" is to be maintained. Upon determining that the error correction mode is to be changed, the error monitor module 81 transmits the mode change request to the partner transmission apparatus.

After transmitting the mode change request to the partner transmission apparatus, the error monitor module 81 may determine in accordance with the error correction ratio and the error ratio that the error correction mode is not to be changed. In such a case, the error monitor module 81 may transmit a cancel request to the partner transmission apparatus. For example, when the error ratio of the received signal temporarily rises, the error monitor module 81 transmits the mode change request and thereafter transmits the cancel request.

The count-value monitor module 82 monitors the count value of the counter module 71 that receives the requests in order from the partner transmission apparatus, and checks the consecutiveness of the count values. If the count value of the counter module 71 is not consecutive, the count-value monitor module 82 transmits the cancel request to the partner transmission apparatus.

The cancel request is to cancel the mode change request previously transmitted by the error monitor module 81. If the partner transmission apparatus receives the cancel request, the partner transmission apparatus does not change the error correction mode responsive to the previously received mode change request.

When the count value received from the partner transmission apparatus reaches a specific value, the mode change module 83 changes the error correction mode. For example, the counter module 71 may decrement a specific initial value. When the count value received from the partner transmission apparatus reaches a count value of zero, the mode change module 83 changes the error correction mode. The mode change module 83 changes the mode from the current error correction mode to the target mode determined by the error monitor module 81. As a result, the pair of transmission apparatuses change to the same error correction mode. The change of the error correction mode of the mode change module 83 is carried out by an operation of providing the mode instruction signal to the selector 46 and an operation of starting up the FEC decoder (44a or 44b) corresponding to the target mode.

If the target mode determined by the error monitor module 81 is "0: no error correction," the mode change module 83 causes the selector 46 to select the output signal of the buffer 43. If the target mode determined by the error monitor module 81 is "1: RS-FEC," the mode change module 83 starts up the FEC decoder 44a and causes the selector 46 to select the output of the FEC decoder 44a. If the target mode determined by the error monitor module 81 is "2: Super FEC," the mode change module 83 starts up the FEC decoder 44b and causes the selector 46 to select the output of the FEC decoder 44b.

The stage flag module 84 indicates an operational state of the receiver within the transmission apparatus 30. In the above example, here, "1" indicates a state in which an operation to change the error correction mode is being performed on the receiver, and "0" indicates a state in which an operation to change the error correction mode is not being performed on the receiver.

As illustrated in FIG. 4, the function of the error correction controller 60 is performed when the processor 61 executes a computer program. The computer program implements part or the whole of each of the counter module 71, the notification module 72, the mode change module 73, the error monitor module 81, the count-value monitor module 82, and the mode change module 83.

The structure of the error correction controller 60 is not limited to the example of the embodiment illustrated in FIG. 4, and may include another element. For example, part or the whole of the function of the error correction controller 60 may be implemented using a circuit such as an application specific integrated circuit (ASIC) or a field programmable gate array (FPGA).

Figure 5:
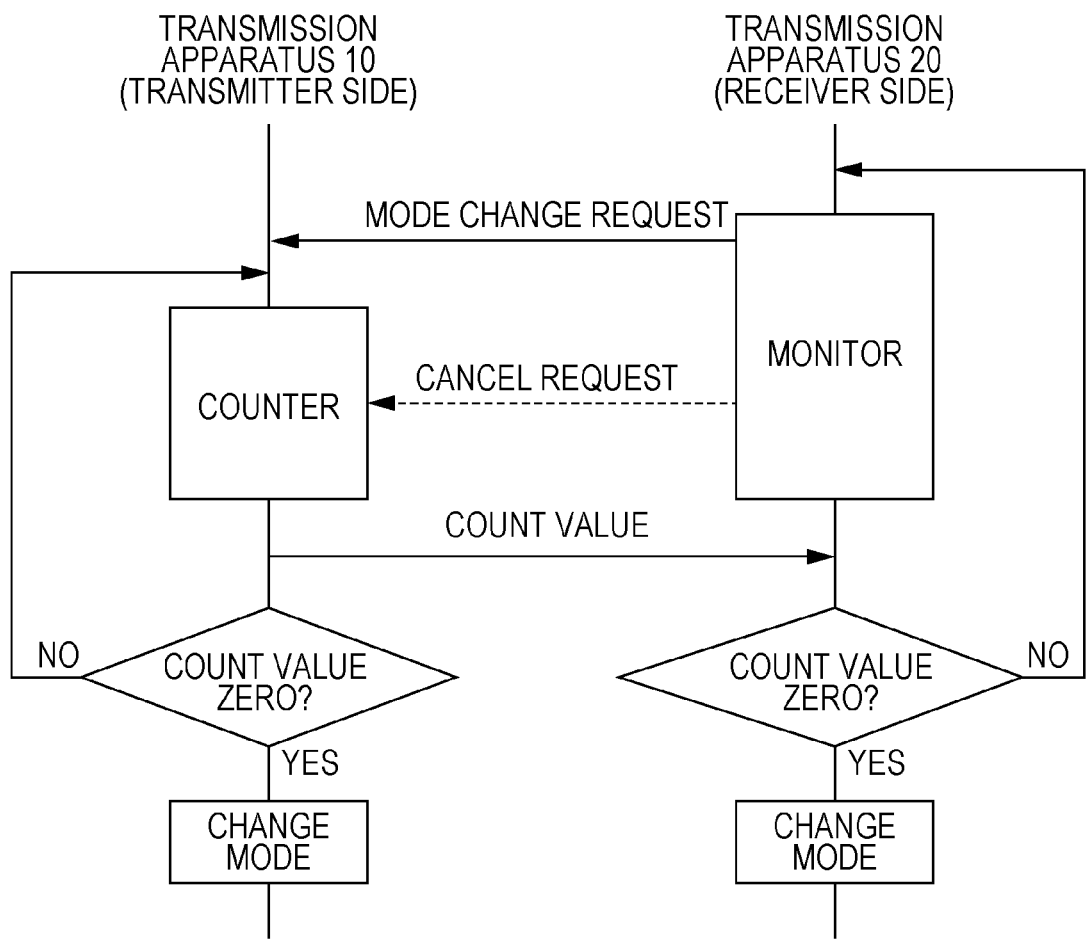
FIG. 5 diagrammatically illustrates a sequence of changing an error correction mode.

FIG. 5 diagrammatically illustrates a sequence in which the error correction mode is changed in the error correction control method of the embodiment. The sequence is discussed with reference to the data transmission of FIG. 2 from the transmission apparatus 10 to the transmission apparatus 20.

The transmission apparatus 20 (receiver side apparatus) monitors one of the error correction ratio and the error ratio of the signal received from the transmission apparatus 10 (transmitter side). If one of the error correction ratio and the error ratio satisfies a specific condition, the transmission apparatus 20 transmits the mode change request to the transmission apparatus 10. The mode change request includes information indicating the target mode (i.e., an error correction mode subsequent to mode change).

Upon receiving the mode change request from the transmission apparatus 20, the transmission apparatus 10 starts up the counter module 71. The counter module 71 is provided with a specific initial value. The transmission apparatus 10 then decrements the count value thereof by one at a time with the specific period. Upon updating the count value at the counter module 71, the transmission apparatus 10 transmits the count value to the transmission apparatus 20.

The transmission apparatus 10 then determines whether the count value of the counter module 71 reaches zero. If the count value has not yet reached zero, the transmission apparatus 10 continues counting. When the count value reaches zero, the transmission apparatus 10 changes the mode from the current error correction mode to the target mode in response to the mode change request received from the transmission apparatus 20.

The transmission apparatus 20 determines whether the count value received from the transmission apparatus 10 reaches zero. If the received count value has not yet reached zero, the transmission apparatus 20 continues to monitor the count value. When the received count value is zero, the transmission apparatus 20 changes the mode from the current error correction mode to the target mode.

In the error correction control method of the embodiment, the error correction mode is dynamically changed in accordance with the line quality in this way. If the line quality is good, a low performance error correction method (or a mode of no correction) is used involving lower power consumption. The switching of the error correction mode is automatically performed as illustrated in the sequence of FIG. 5. Workload and costs used to manage the network are reduced.

The receiver side apparatus detects the timing of switching the error correction mode in response to the count value generated on the transmitter side apparatus. The transmitter side apparatus and the receiver side apparatus switch the error correction mode at the same timing. This arrangement controls or restricts a reproduction failure of a transmission frame at the switching of the error correction mode. The data transmission is performed without interruption.

After the mode change request is transmitted from the transmission apparatus 20 to the transmission apparatus 10, the transmission apparatus 20 may revert back to a state in which one of the error correction ratio and the error ratio does not satisfy the specific condition. The transmission apparatus 20 may then transmit the cancel request to the transmission apparatus 10. Upon receiving the cancel request, the transmission apparatus 10 suspends the counter module 71. In this state, the count value does not reach zero. The transmission apparatus 10 and the transmission apparatus 20 maintain the current error correction mode without changing the mode.

The transmission system 1 of the embodiment transmits the OTN frame herein. In the transmission system 1, the overhead of the OTN frame is used to exchange control information related to the error correction mode change (including the count value, the mode change request, and the cancel request) between the transmission apparatus 10 and the transmission apparatus 20. In other words, the control information is attached to the communication signal of the transmission system 1. The transmission apparatus 10 and the transmission apparatus 20 switch the error correction mode at the same timing, and the communication signal is free from interruption at the switching of the error correction mode. The "communication signal" corresponds to the frame for conveying the client data between the transmission apparatus 10 and the transmission apparatus 20. If the control signal is exchanged between the transmission apparatus 10 and the transmission apparatus 20 independent of the communication signal of the transmission system 1, a transmission delay between the transmission apparatuses 10 and 20 makes it difficult for the transmission apparatuses 10 and 20 to align in switching timing of the error correction mode.

Figure 6A:
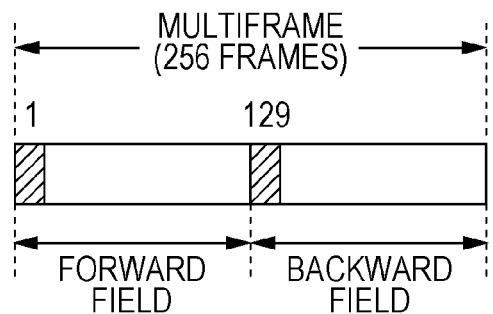
FIGS. 6A-6C illustrate a method of transmitting control information using fault type and fault location (FTFL) reporting communication channel.

In the error correction control method of the embodiment, the control signal is transmitted using a fault type and fault location (FTFL) reporting communication channel of FIG. 2. As defined in ITU-T G. 709, FTFL is used to transmit information in multiframe scheme. More specifically, as illustrated in FIG. 6A, information is transmitted using 256 frames as a single multiframe frame. A first through a 128th frame serve as a forward field, and is allocated to transmit information in a forward direction (in a direction from the transmission apparatus 10 to the transmission apparatus 20). A 129th frame to a 256th frame serve as a backward field and is allocated to transmit information in a backward direction (in a direction from the transmission apparatus 20 to the transmission apparatus 10).

FTFL of the first frame of each multiframe frame is used as a fault indication field for transmitting a fault indication code in the forward direction. FTFL of the 129th frame of each multiframe frame is used as a fault indication field for transmitting a fault indication code in the backward direction.

The control information of the error correction control method is transmitted using the fault indication field. According to the embodiment, one set of control information is transmitted using two multiframe frames.

Figure 6B:
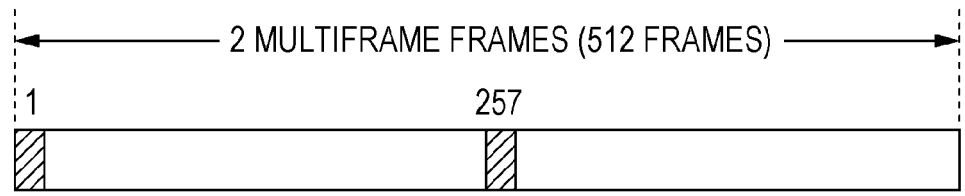
Figure 6C:
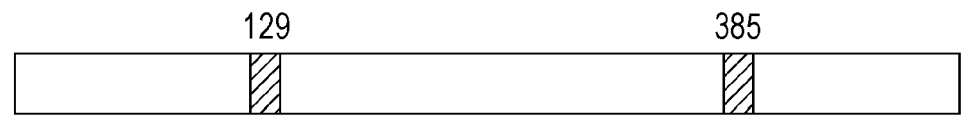

As illustrated in FIG. 6B, one set of control information (such as the count value) is transmitted in the forward direction (i.e., in the direction from the transmission apparatus 10 to the transmission apparatus 20) using FTFL of the first frame of each multiframe frame (i.e., first frame and 257th frame). As illustrated in FIG. 6C, one set of control information (such as the mode change request and the cancel request) is transmitted in the backward direction (i.e., in the direction from the transmission apparatus 20 to the transmission apparatus 10) using FTFL of the 129th frame of each multiframe frame (i.e., 129th frame and 385th frame).

Figures 7A, 7B:
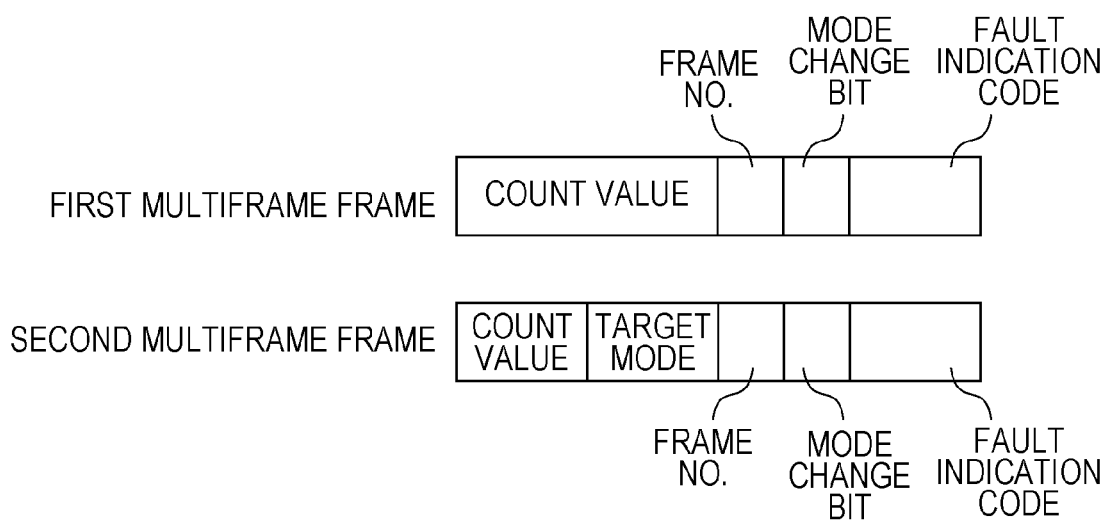
FIG. 7A illustrates a fault indication code.
FIG. 7B illustrates a specific embodiment of control information.

FIG. 7A illustrates the fault indication code defined in ITU-T G. 709. The fault indication code is identified by the two least significant bits of an 8-bit fault indication field, in practice. In other words, the six upper bits of the fault indication field are not used. For this reason, the six upper bits of the fault indication field are used to transmit the control information in the error correction control method of the embodiment.

FIG. 7B illustrates an example of the embodiment of the control information. The control information is transmitted using two multiframe frames. More specifically, one set of control information is transmitted using two fault indication fields.

The first through fourth bits of the first multiframe frame, and the first and second bits of the second multiframe frame are used to transmit the count value in the forward direction. In this case, "0" through "63" may be transmitted as a count value. The third and fourth bits of the second multiframe frame are used to identify the target mode (i.e., the error correction mode subsequent to mode changing). In this example of the embodiment, "00" represents "no error correction," "01" represents "RS-FEC," and "10" represents "Super FEC."

The fifth bit of each multiframe frame identifies which of the first multiframe frame and the second multiframe frame the multiframe frame is. For example, "0" is attached to the first multiframe frame and "1" is attached to the second multiframe frame in the two multiframe frames. The sixth bit of each multiframe frame serves as a mode change bit. For example, "1" represents the changing of the error correction mode, and "0" represents no change in the error correction mode. The mode change request may be honored by transmitting "the mode change bit=1." Alternatively, the cancel request may be honored by transmitting "the mode change bit=1." The values of the mode change bits are the same in the first multiframe frame and the second multiframe frame.

Figure 8:
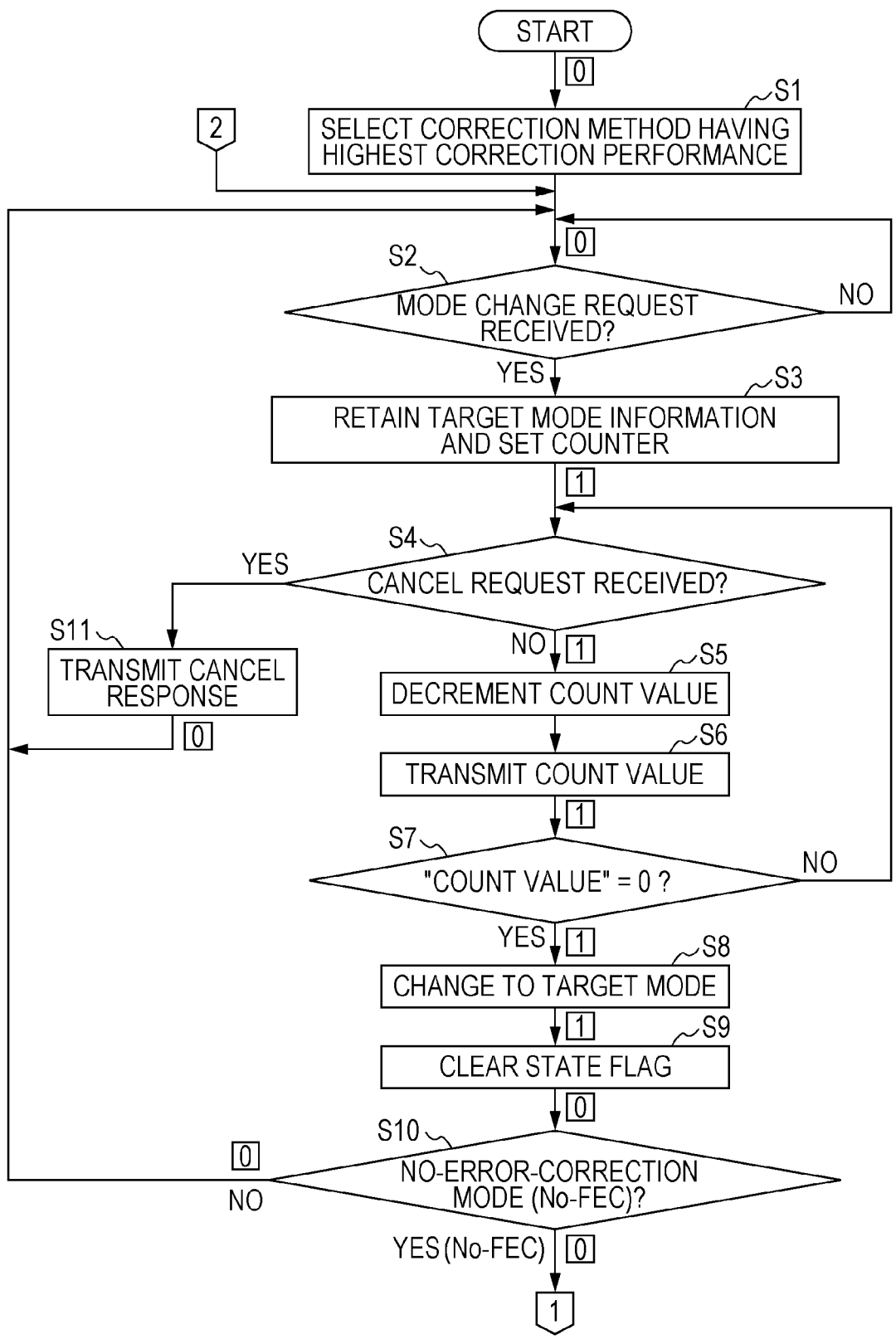
FIG. 8 is a flowchart illustrating a process of a transmitter-side apparatus.
Figure 9:
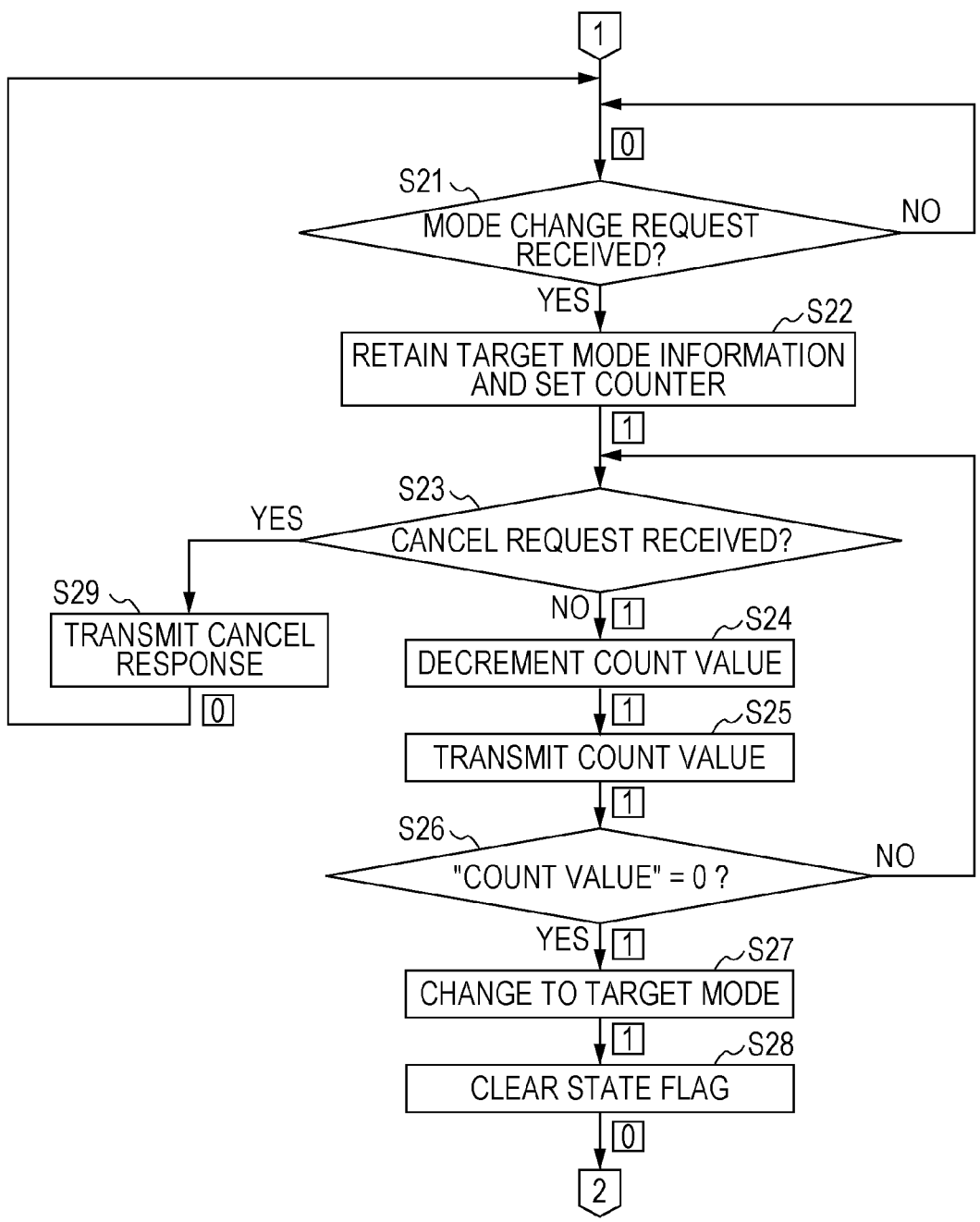
FIG. 9 is a continuation of the flowchart of FIG. 8.

FIGS. 8 and 9 are flowchart of a process of the transmitter side apparatus (the transmitter in the transmission apparatus). The process of the flowchart is performed by the error correction controller 60 (for example, the counter module 71, the notification module 72, and the mode change module 73).

In S1, the error correction controller 60 selects the error correction mode having the highest error-correction performance. For example, if "Super FEC," "RS-FEC," and "no error correction" are available as the error correction modes, "Super FEC" is selected. The error correction controller 60 then starts up the FEC encoder 52b, and causes the selector 53 to select the output of the FEC encoder 52b. In other words, the transmitter side apparatus transmits the OTN frame having the Super-FEC based error correction code attached thereto.

As illustrated in FIGS. 8 and 9, numbers "0" and "1" in boxes in the vicinity of steps represent states of the state flag module 74. Here, "1" represents a state in an operation to change the error correction mode is being performed, and "0" represents a state in which an operation to change the error correction mode is not being performed. The initial state of the counter module 71 is thus "0."

In S2, the error correction controller 60 monitors the reception of the mode change request. As previously discussed with reference to FIG. 5, the mode change request is generated if the specific condition is satisfied on the receiver side apparatus. In the example of FIGS. 6A-6C, 7A, and 7B, the mode change request is honored by setting "1" at the sixth bit of the fault indication field that is transmitted in the backward direction. The mode change request may further include the target mode (i.e., the error correction mode subsequent to mode changing). Upon receiving the mode change request, the error correction controller 60 executes an operation in S3.

In S3, the error correction controller 60 retains, on a specific memory area, target mode information representing the target mode specified by the mode change request. The error correction controller 60 also updates the state flag module 74 from "0" to "1." The error correction controller 60 supplies the counter module 71 with an initial value. The initial value may be an integer equal to or larger than 5.

The error correction controller 60 repeats the operations in S4 through S7 with a specific period. The "specific period" corresponds to time used to transmit two multiframe frames. More specifically, the "specific period" is time allocated to 512 OTN frames.

The error correction controller 60 monitors the reception of the cancel request in S4. The cancel request is generated as described with reference to FIG. 5 when the specific condition is not satisfied on the receiver side apparatus. If the cancel request is not detected, the error correction controller 60 decrements the count value of the counter module 71 by one in S5. In S6, the error correction controller 60 transmits the count value of the counter module 71 to the receiver side apparatus. As described above with reference to FIGS. 6A-6C and 7A and 7B, the count value is transmitted using FTFLs of the first frame and the 257th frame (i.e., the fault indication fields in the forward direction).

In S7, the error correction controller 60 determines whether the count value of the counter module 71 is zero. If the count value of the counter module 71 is not zero, the error correction controller 60 returns to S4. The count value of the counter module 71 is decremented by one each time a 512-frame period has elapsed. If the count value of the counter module 71 is zero, the error correction controller 60 executes operations S8 through S10.

In S8, the error correction controller 60 changes the error correction mode to the target mode in response to the mode change request received in S2. In S9, the error correction controller 60 updates the state flag module 74 from "1" to "0."

In S10, the error correction controller 60 determines whether a new error correction mode is a "no-error-correction mode." If the new error correction mode is the no-error-correction mode, the error correction controller 60 proceeds to S21. If the new error correction mode is not the no-error-correction mode, the error correction controller 60 returns to S2.

If the cancel request is detected (yes in S4), the error correction controller 60 updates the count value of the state flag module 74 from "1" to "0" in S11. The transmitter side apparatus stops changing the error correction mode. The error correction controller 60 transmits to the receiver side apparatus a cancel response to the cancel request received in S4. The cancel response is transmitted using FTFLs of the first frame and the 257th frame (i.e., the fault indication fields in the forward direction). The cancel response is executed by writing the updated state flag module 74 (i.e., "0") onto the mode change bit of FIG. 7B.

S21 through S29 of FIG. 9 illustrate the process of the transmitter side apparatus performed when the error correction mode is the no-error-correction mode. Operations in S21 through S28, and S29 are substantially identical to operations in S2 through S9, and S11 of FIG. 8. S21 through S29 are not discussed herein. If the error correction mode is changed in the course of S21 through S29, the error correction controller 60 returns to S2.

Figure 10:
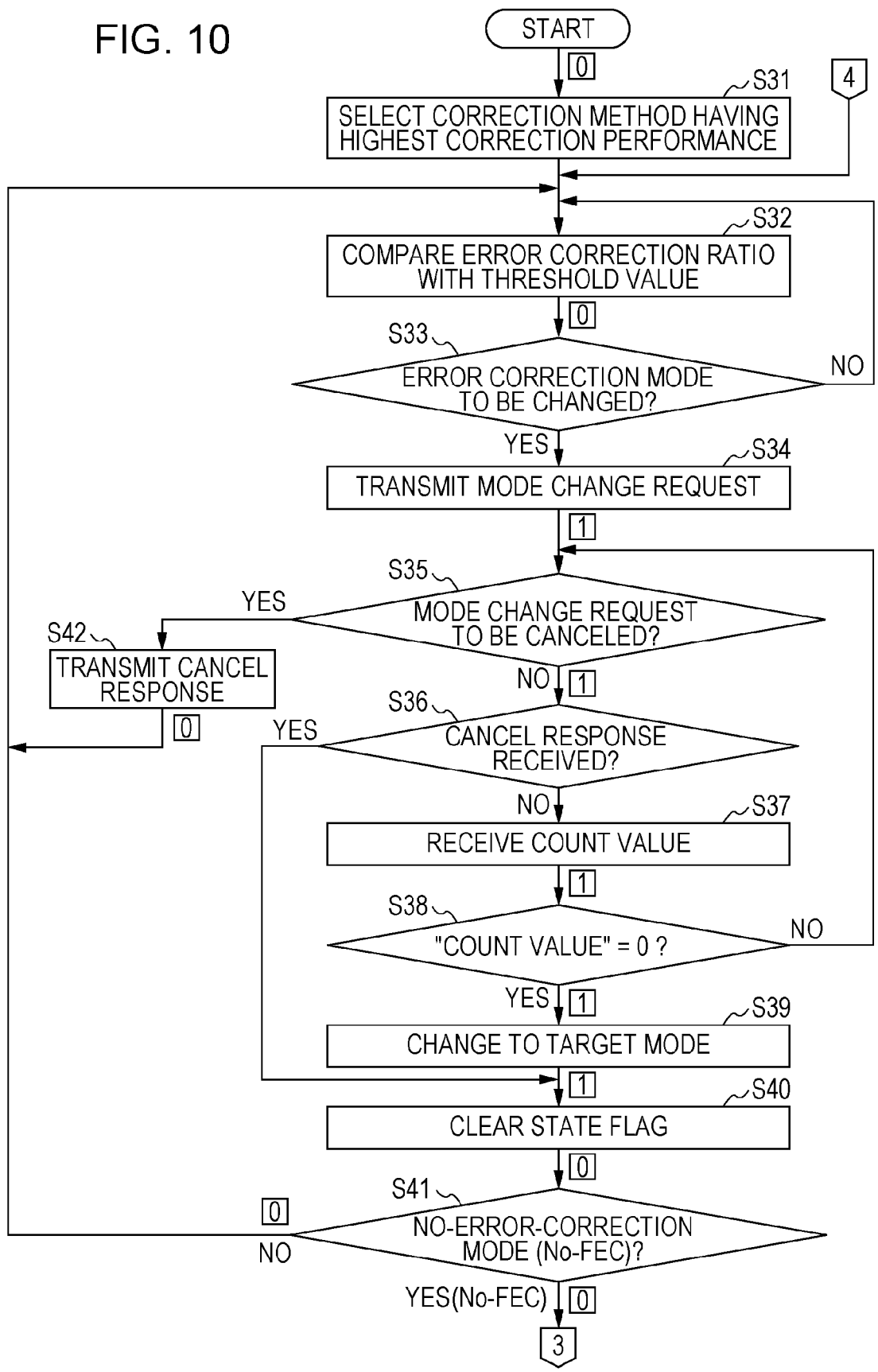
FIG. 10 is a flowchart illustrating a process of a receiver-side apparatus.
Figure 11:
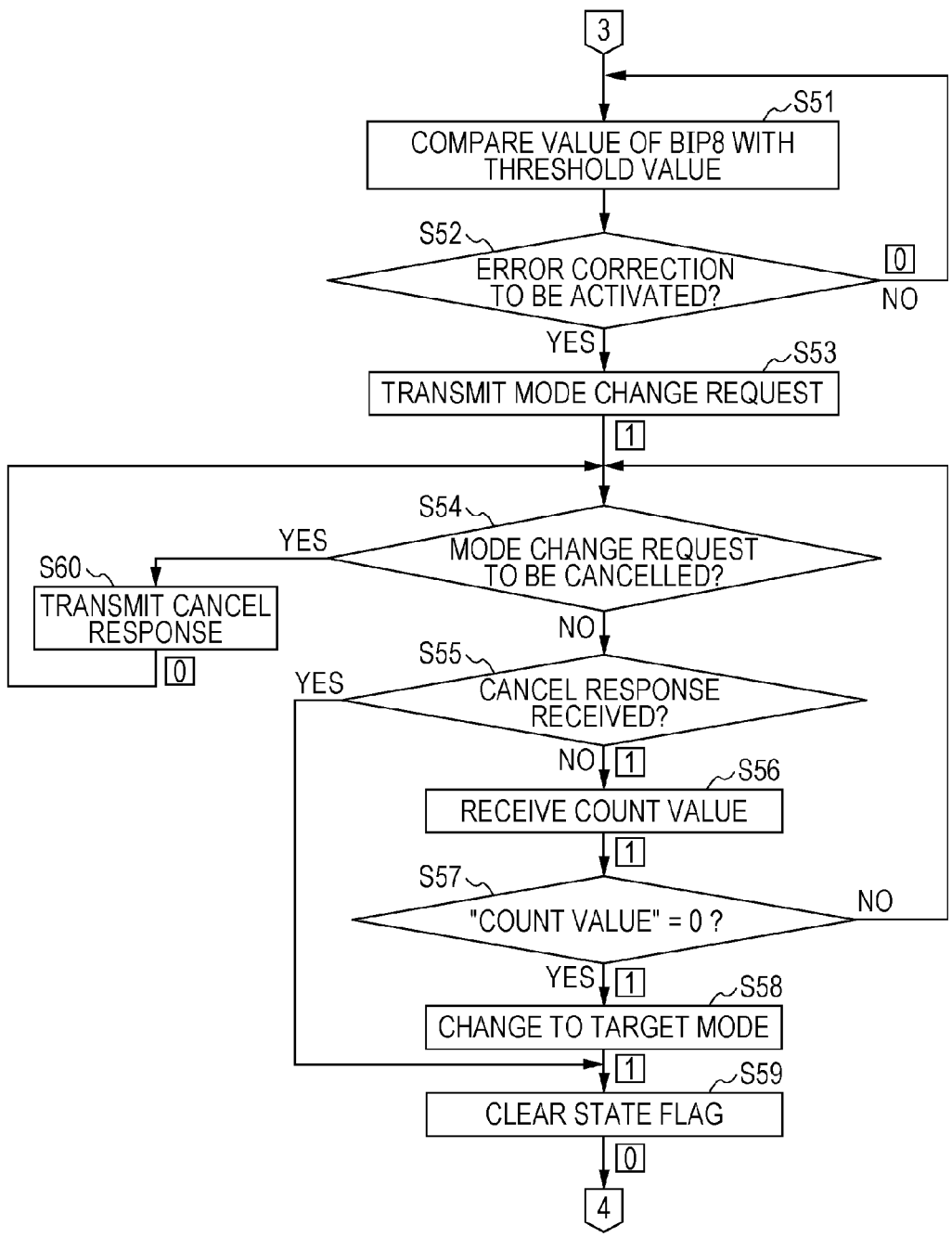
FIG. 11 is a continuation of the flowchart of FIG. 10.

FIGS. 10 and 11 are a flowchart illustrating a process of the receiver side apparatus (the receiver within the transmission apparatus). The process of the flowchart is executed by the error correction controller 60 (including the error monitor module 81, the count-value monitor module 82, and the mode change module 83, for example).

In S31, the error correction controller 60 selects the error correction mode having the highest error-correction performance. If "Super FEC," "RS-FEC," and "no error correction" are available as the error correction modes, "Super FEC" is selected. In such a case, the error correction controller 60 starts up the FEC decoder 44b, and causes the selector 46 to select the output signal of the FEC decoder 44b.

In S32 and S33, the error correction controller 60 monitors the error correction ratio of the signal received from the partner transmission apparatus. If the current error correction mode is Super FEC, the error correction controller 60 retrieves the error correction ratio calculated by the error correction ratio detector 45b. If the current error correction mode is RS-FEC, the error correction controller 60 retrieves the error correction ratio calculated by the error correction ratio detector 45*a*. The error correction controller 60 compares the retrieved error correction ratio with a threshold value set for the current error correction mode.

If the comparison results indicate that the error correction mode is not to be changed, the error correction controller 60 continues monitoring the error correction ratio. If the comparison results indicate that the error correction mode is to be changed, the error correction controller 60 proceeds to S34.

It is noted that the monitoring of the error correction ratio is continuously performed. More specifically, the error correction controller 60 continuously monitors the error correction ratio while performing S34 through S42.

Operations in S32 and S33 are specifically described herein. A threshold value for Super FEC may now be $5 \times 10^{-5}$. An upper limit threshold value for RS-FEC may now be $5 \times 10^{-5}$. A lower limit threshold value for RS-FEC may now be $1 \times 10^{-15}$. If the error correction ratio becomes lower than $5 \times 10^{-5}$ with Super FEC serving as the current error correction mode, the error correction controller 60 determines that the current error correction mode be changed to RS-FEC for lower power consumption. If the error correction ratio rises above $5 \times 10^{-5}$ with RS-FEC serving as the current error correction mode, the error correction controller 60 determines that the current error correction mode be changed to Super FEC for higher error correction performance. If the error correction ratio becomes lower than $1 \times 10^{-15}$ with the current error correction ratio in RS-FEC, the error correction controller 60 determines that the current error correction mode be changed to the no-error-correction mode for lower power consumption.

In S34, the error correction controller 60 generates and transmits the mode change request to the partner transmission apparatus. The error correction controller 60 updates the stage flag module 84 from "0" to "1." The mode change request is transmitted using FTFLs of the 129th frame and the 385th frame (i.e., the fault indication fields in the backward direction). The mode change request may be honored by writing "1" onto the mode change bit of FIG. 7B. The mode change request in this case includes information identifying the target mode. The information identifying the target mode is transmitted using the third bit and the fourth bit of the fault indication field in the second multiframe frame.

In S35 through S38, the error correction controller 60 waits for the count value from the partner transmission apparatus while monitoring the error correction ratio of the received signal. The count value is updated with the specific period on the partner transmission apparatus and is then transmitted in order. The error correction controller 60 receives the updated count values in order. If the count value received from the partner transmission apparatus is not zero, the error correction controller 60 repeats operations in S35 through S38. If the count value received from the partner transmission apparatus is zero, the error correction controller 60 proceeds to S39.

In S39, the error correction controller 60 changes the error correction mode to the target mode in accordance with the determination results through S32 and S33. In S40, the error correction controller 60 updates the stage flag module 84 from "1" to "0."

In S41, the error correction controller 60 determines whether a new error correction mode is the "no-error-correction mode." If the new error correction mode is the "no-error-correction mode," the error correction controller 60 proceeds to S51. If the new error correction mode is not the "no-error-correction mode," the error correction controller 60 returns to S32.

In S35 through S38, if an event resulting in the cancellation of the mode change request is detected (yes in S35), the error correction controller 60 transmits the cancel request to the partner transmission apparatus in S42. The error correction controller 60 then updates the stage flag module 84 from "1" to "0." The cancel request is transmitted using FTFLs of the 129th frame and the 385th frame (i.e., the fault indication fields in the backward direction). The mode change request may be honored by writing "0" on the mode change bit of FIG. 7B.

The current error correction mode may be Super FEC, and the error correction ratio of the received signal may become lower than $5 \times 10^{-5}$ temporarily and then later rise above $5 \times 10^{-5}$. In such a case, the error correction controller 60 transmits to the partner transmission apparatus the mode change request to change the error correction mode to RS-FEC, and then later transmits the partner transmission apparatus the cancel request to cancel the mode change request. The current error correction mode may now be RS-FEC, and the error correction ratio of the received signal may become higher than $5 \times 10^{-15}$ temporarily and then later become lower than $5 \times 10^{-15}$. In such a case, a cancel request is also generated. The current error correction mode may now be RS-FEC, and the error correction ratio of the received signal may become lower than $1 \times 10^{-15}$ temporarily and then later become higher than $1 \times 10^{-15}$. In such a case, a cancel request is also generated.

If the cancel response to the cancel request is received from the partner transmission apparatus (yes in S36) in the course of S35 through S38, the error correction controller 60 skips S37 through S39, and updates the stage flag module 84 from "1" to "0" in S40. In other words, the error correction controller 60 ends the process of changing the error correction mode. The cancel response is generated on the partner transmission apparatus in S11 or S29.

In the error correction control method of the embodiment, the mode change request caused by a transient variation in the line quality may be occasionally canceled later. The frequency of occurrence of switching of the error correction mode is thus controlled.

S51 through S60 indicate the process of the receiver side apparatus with the error correction mode in the "no-error-correction mode." S51 through S59, and S60 are substantially identical in operation to S32 through S40, and S42 illustrated in FIG. 10. The following discussion focuses on a difference between S51 through S59, and S60 and S32 through S40, and S42.

In S51 and S52, the error correction controller 60 monitors the error ratio of the signal received from the partner transmission apparatus. The error correction controller 60 retrieves the error ratio calculated by the BIP8 detector 48. The error correction controller 60 then compares the retrieved error ratio with a threshold value set in the current error correction mode.

If the comparison results indicate that no change is to be performed in the error correction mode, the error correction controller 60 continuously monitors the error ratio. If the comparison results indicate that the error correction mode is to be changed, the error correction controller 60 generates and transmits the mode change request to the partner transmission apparatus in S53. The target mode specified by the mode change request may be the error correction method having the lowest error correction performance (here RS-FEC).

S54 through S59 and S60 are substantially identical in operation to S35 through S40 and S42 of FIG. 10. The discussion of the operations in S54 through S59, and S60 is thus omitted here.

Upon detecting an event that necessitates the change of the error correction mode in the error correction control method of the embodiment, the receiver side apparatus transmits the mode change request to the transmitter side apparatus before actually changing the error correction mode. The transmitter side apparatus transmits the count values generated thereby to the receiver side apparatus successively. The transmitter side apparatus and the receiver side apparatus are thus synchronized in the switching timing of the error correction mode.

The count value generated by the transmitter side apparatus is added to the communication signal, and the communication signal with the count value is then transmitted to the receiver side apparatus. When a first communication signal frame with the new error correction mode applied is received by the receiver side apparatus, the receiver side apparatus switches the error correction mode to the new error correction mode. The error correction mode is thus changed without data interruption regardless of a transmission delay time between the transmitter side apparatus and the receiver side apparatus.

In the error correction control method of the embodiment, the count value generated by the transmitter side apparatus is transmitted to the receiver side apparatus in the multiframe scheme. In one example, one count value is transmitted using 512 frames. In the method of the embodiment, the number of bits for transmitting the count value is small in comparison with the case in which the count value is attached to each frame.

FIGS. 12 through 17 illustrate examples of the embodiment of the error correction control method. The changing of the error correction mode of the data transmission from the transmission apparatus 10 to the transmission apparatus 20 is described below. The mode change request to cause the transmission apparatuses 10 and 20 currently operating in an error correction mode X to operate in an error correction mode Y may now be transmitted from the transmission apparatus 20 to the transmission apparatus 10.

The transmission apparatus 10 decrements the count value on the counter module 71 with the specific period. In the example of the embodiment, the count value is decremented by one every 512 frames (2 multiframe frames). Also in the example of the embodiment, the transmission delay between the transmission apparatuses 10 and 20 is time corresponding to 1024 frames (4 multiframe frames). The delay time here includes time to process the multiframe frames.

Figure 12:
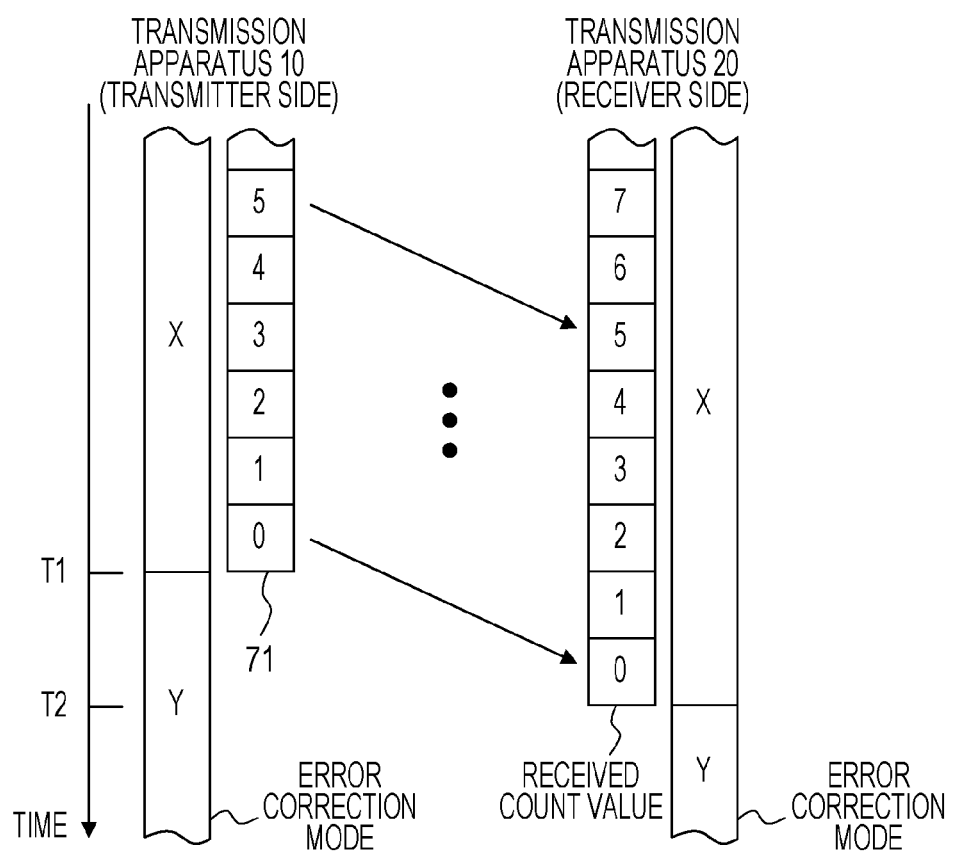
FIG. 12 illustrates a sequence of an error correction control.

FIG. 12 illustrates a standard sequence of changing the error correction mode. In the transmission apparatus 10, the counter module 71 is decremented by one at a time. The transmission apparatus 20 receives the count values in order from the transmission apparatus 10.

When the count value becomes zero, the transmission apparatus 10 changes the error correction mode from a mode X to a mode Y. As illustrated in FIG. 12, the transmission apparatus 10 changes the error correction mode from the mode X to the mode Y at time T1. When the count value received from the transmission apparatus 10 becomes zero, the transmission apparatus 20 changes the error correction mode from the mode X to the mode Y. Referring to FIG. 12, the transmission apparatus 20 changes the error correction mode from the mode X to the mode Y at time T2.

In the sequence, the frame transmitted from the transmission apparatus 10 at time T1 is received by the transmission apparatus 20 at time T2. Frame missing, causes by a failure in error correction decoding, does not occur if the transmission apparatus 10 changes the error correction mode at time T1, and the transmission apparatus 20 changes the error correction mode at time T2. The error correction mode is thus dynamically changed with data transmission continued.

Figure 13:
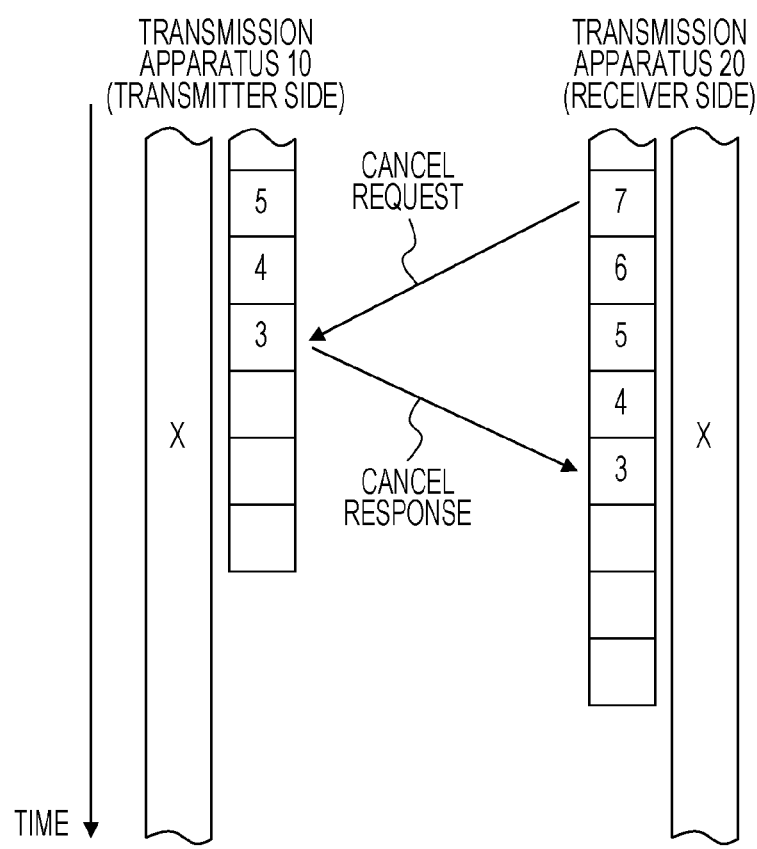
FIG. 13 illustrates a sequence of the error correction control.

FIG. 13 illustrates a sequence of cancelling the mode change request. The cancel request is transmitted from the transmission apparatus 20 to the transmission apparatus 10. If a drop in the line quality between the transmission apparatuses 10 and 20 is transient, the transmission apparatus 20 may transmit the cancel request subsequent to the transmission of the mode change request.

Referring to FIG. 13, the transmission apparatus 10 with the count value thereof being 3 receives the cancel request from the transmission apparatus 20. The transmission apparatus 10 suspends the counter module 71. The transmission apparatus 10 then transmits the cancel response to the received cancel request to the transmission apparatus 20. If the cancel request is received in the flowchart of FIG. 8, the determination result in S4 is yes. A decrement operation in S5 is not performed thereafter, and the counter module 71 remains suspended. In S11, the cancel response is transmitted.

Since the count value on the counter module 71 in the transmission apparatus 10 is not zero, the error correction mode X is maintained. The transmission apparatus 20 maintains the error correction mode X because "the count value=0" is not received from the transmission apparatus 10. The transmission apparatuses 10 and 20 operate in the same error correction mode. If the cancel response is received in operations in S35 through S38, the error correction controller 60 in the transmission apparatus 20 skips S39 for changing the error correction mode.

Figure 14:
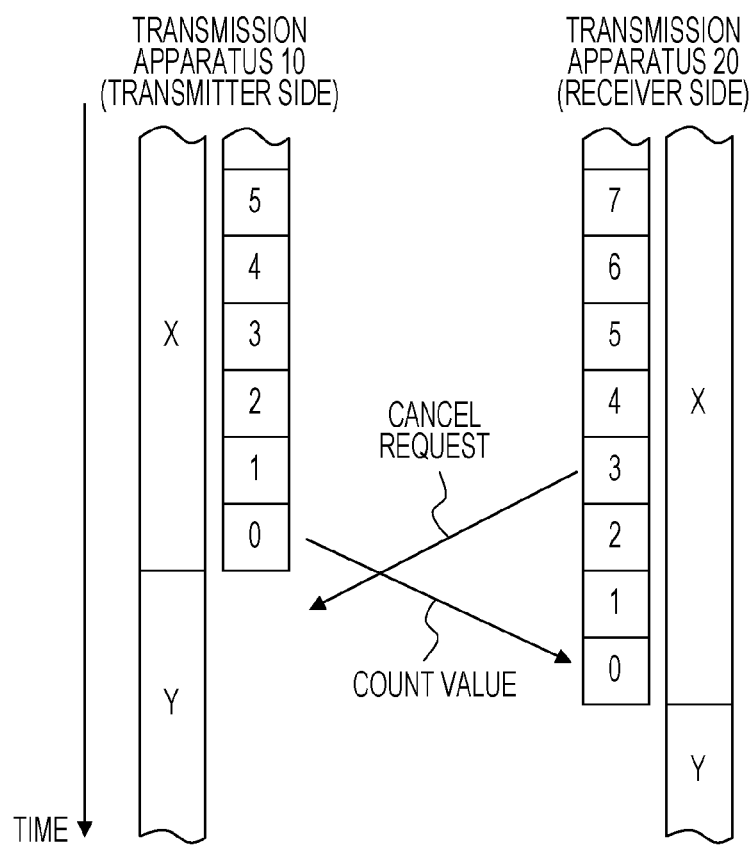
FIG. 14 illustrates a sequence of the error correction control.

FIG. 14 illustrates a sequence in which cancelling of the mode change request is not in time. In the same manner as illustrated in FIG. 13, the transmission apparatus 20 transmits the cancel request to the transmission apparatus 10. In FIG. 14, however, the count value of the counter module 71 in the transmission apparatus 10 becomes already zero before the transmission apparatus 10 receives the cancel request.

The transmission apparatus 10 changes the error correction mode from the mode X to the mode Y when the count value becomes zero. The transmission apparatus 10 transmits "the count value=0" to the transmission apparatus 20 before receiving the cancel request. The transmission apparatus 20 thus receives "the count value=0" without receiving the cancel response. The transmission apparatus 20 as well changes the error correction mode from the mode X to the mode Y.

If the transmission apparatus 10 changes the error correction mode before receiving the cancel request, the transmission apparatus 20 changes the error correction mode in the same manner as the transmission apparatus 10 changes the error correction mode. A mismatch in the error correction mode between the transmission apparatuses 10 and 20 is thus controlled.

Figure 15:
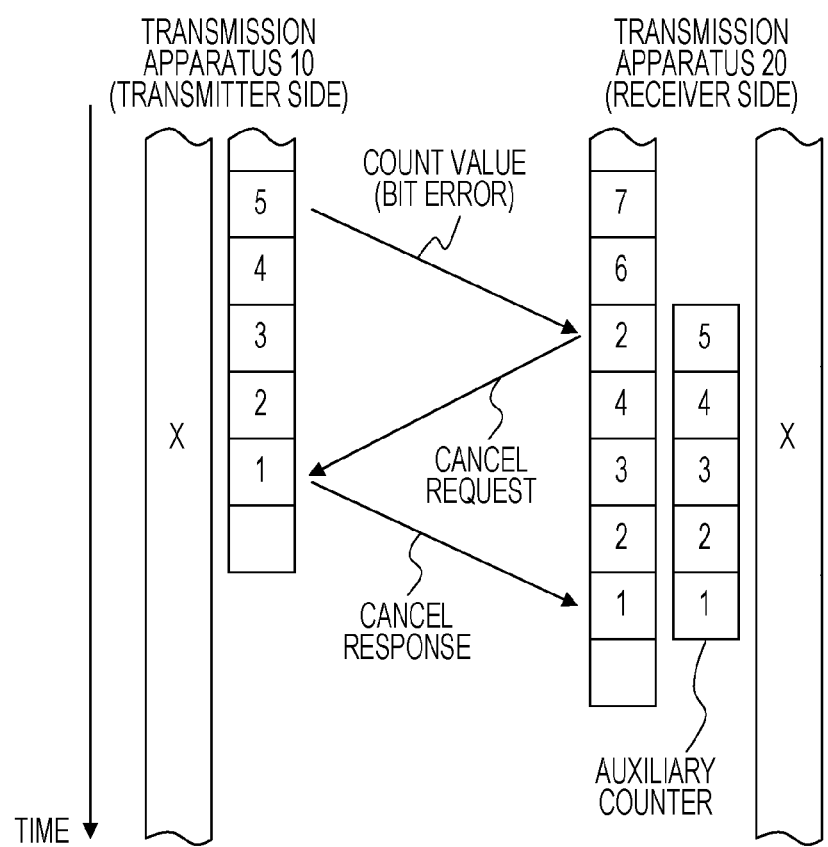
FIG. 15 illustrates a sequence of the error correction control.

FIG. 15 illustrates a sequence in which the mode change request is canceled in response to a bit error. Upon receiving the mode change request (not illustrated) from the transmission apparatus 20, the transmission apparatus 10 decrements the count value on the counter module 71. The count value is decremented by one at a time. In other words, the count values are consecutive. The count values successively received by the transmission apparatus 20 are therefore consecutive.

As illustrated in FIG. 15, a bit error occurs in data representing "the count value=5" transmitted from the transmission apparatus 10, and the transmission apparatus 20 receives "the count value=2." The transmission apparatus 20 monitors the consecutiveness of the count values received from the transmission apparatus 10. Upon detecting a nonconsecutiveness in the count values, the transmission apparatus 20 generates and transmits the cancel request to the transmission apparatus 10. Upon detecting the nonconsecutiveness in the count values, the transmission apparatus 20 starts up an auxiliary counter. The auxiliary counter operates in a manner such that the consecutiveness of the count values successively received from the transmission apparatus 10 is maintained. In the example of FIG. 15, the count value received immediately before the transmission apparatus 20 detects the nonconsecutiveness is "6." The auxiliary counter thus starts downcounting with "5." The transmission apparatus 20 causes the auxiliary counter to downcount the count value thereof at the moment when the new count value is received from the transmission apparatus 10. In other words, the auxiliary counter is updated every 512 frames in the example of the embodiment.

Upon receiving the cancel request from the transmission apparatus 20, the transmission apparatus 10 stops the counter module 71. In this case, the transmission apparatus 10 does not change the error correction mode. The transmission apparatus 10 transmits the cancel response to the cancel request to the transmission apparatus 20. Upon receiving the cancel response, the transmission apparatus 20 stops the auxiliary counter, and maintains the error correction mode. The transmission apparatuses 10 and 20 maintain the mode X.

If the count values successively received by the transmission apparatus 20 are not consecutive, the reliability of the line between the transmission apparatuses 10 and 20 is considered to be low. When the reliability of the line is low, the content of the mode change request previously transmitted may not be correctly conveyed to the transmission apparatus 10. For example, the transmission apparatus 20 may now transmit the mode change request representing "the target mode=Y," and the mode change request received by the transmission apparatus 10 may represent "the target mode=Z." In such a case, the error correction mode becomes different between the transmission apparatuses 10 and 20. Upon detecting a nonconsecutiveness in the count values, the transmission apparatus 20 transmits a request to cancel the preceding mode change request to the transmission apparatus 10. As a result, a mismatch in the error correction mode between the transmission apparatuses 10 and 20 is controlled.

Figure 16:
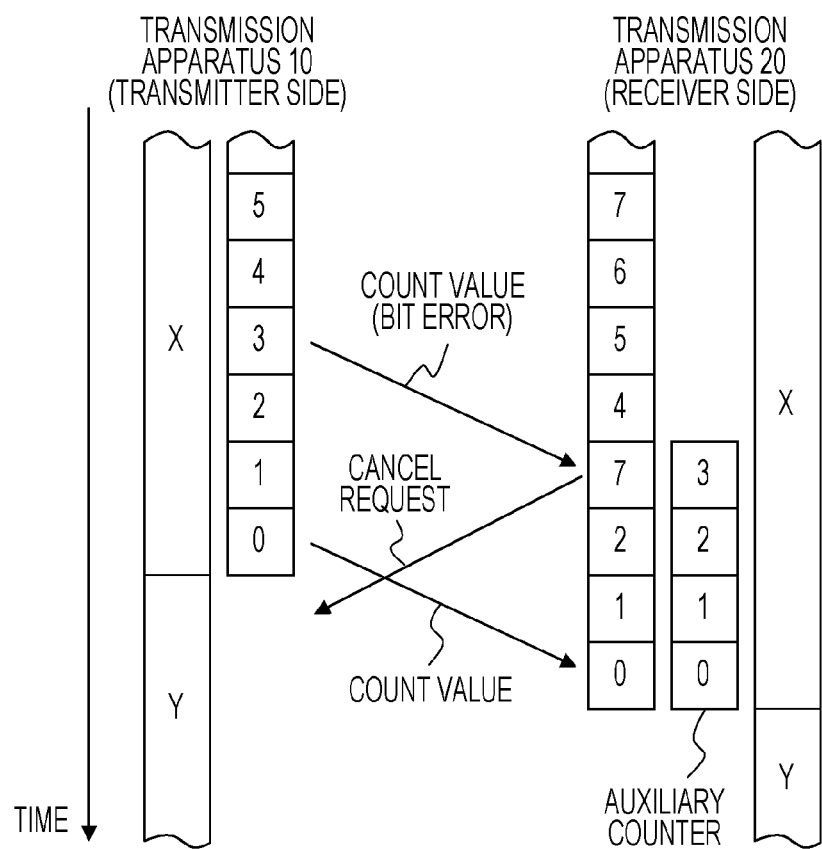
FIG. 16 illustrates a sequence of the error correction control.

FIG. 16 illustrates a sequence in which canceling caused in response to a bit error is not in time. The transmission apparatus 20 receives "the count value=7" subsequent to "the count value=4." The transmission apparatus 20 thus detects a nonconsecutiveness in the count values, and generates and transmits the cancel request to the transmission apparatus 10. The transmission apparatus 20 starts up the auxiliary counter. In the example of FIG. 16, the count value received immediately before the transmission apparatus 20 detects the nonconsecutiveness is "4." The auxiliary counter starts downcounting the count value thereof with "3."

The cancel request is thus transmitted from the transmission apparatus 20 to the transmission apparatus 10. In the same manner as illustrated in FIG. 14, the count value on the counter module 71 in the transmission apparatus 10 becomes zero before the transmission apparatus 10 receives the cancel request. The transmission apparatus 10 changes the error correction mode from the mode X to the mode Y.

The transmission apparatus 20 causes the auxiliary counter to count the count value thereof continuously. If the count value on the auxiliary counter becomes zero before the cancel request is received, the transmission apparatus 20 changes the error correction mode from the mode X to the mode Y. The downcounting operation of the count value on the auxiliary counter is synchronized with the timing at which the count value is received from the transmission apparatus 10. In other words, the transmission apparatus 20 changes the error correction mode at the timing when the count value received from the transmission apparatus 10 is expected to become zero. A mismatch in the error correction mode between the transmission apparatuses 10 and 20 is thus controlled.

Figure 17:
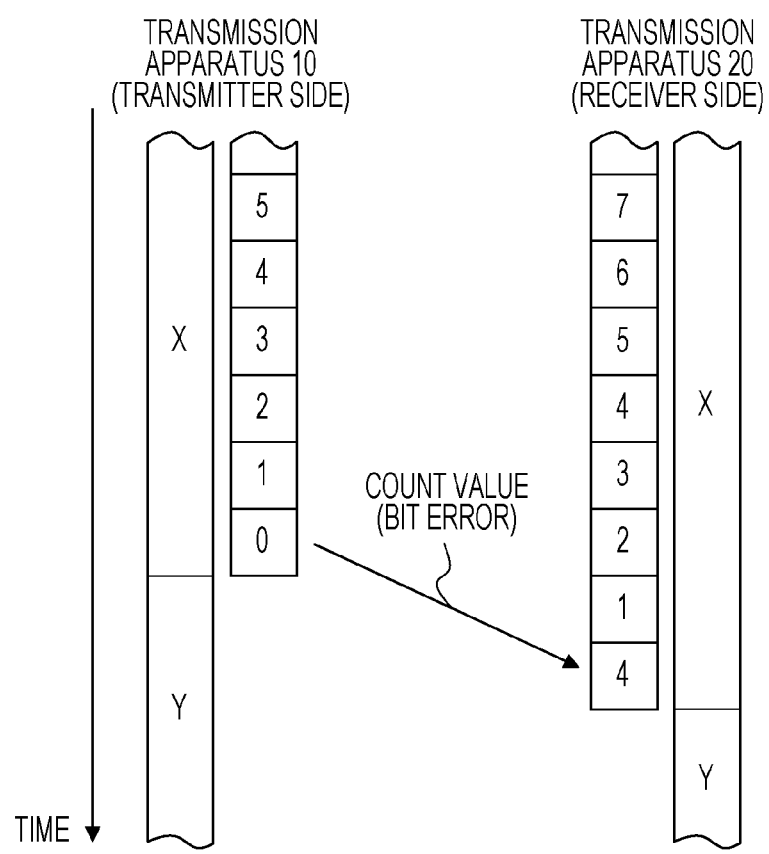
FIG. 17 illustrates a sequence of the error correction control.

FIG. 17 illustrates another sequence in which canceling caused in response to a bit error is not in time. A bit error may occur in data representing "the count value=0" and the transmission apparatus 20 may receive "the count value=4." At the moment the count value reaches zero, the transmission apparatus 10 changes the error correction mode from the mode X to the mode Y.

Upon detecting a nonconsecutiveness in the count values, the transmission apparatus 20 checks the count value received immediately before. In this example of the embodiment, the count value received immediately before is "1." The timing when the nonconsecutiveness is detected is the timing when the transmission apparatus 20 is expected to receive "the count value=0." In this case, the error correction mode is already changed in the transmission apparatus 10. The transmission apparatus 20 changes the error correction mode from the mode X to the mode Y without generating the cancel request.

At the timing when the count value received from the transmission apparatus 10 is expected to become zero, the transmission apparatus 20 in this way changes the error correction mode, not in response to the count value actually received from the transmission apparatus 10. In this way, a mismatch in the error correction mode between the transmission apparatuses 10 and 20 is controlled. As illustrated in FIGS. 15 and 16, the transmission apparatus 20 generates and transmits the cancel request to the transmission apparatus 10 when the transmission apparatus 20 detects the nonconsecutiveness in the count values. The transmission apparatus 20 may change the error correction mode at the timing that is expected based on the count value received immediately before.

Figure 18:
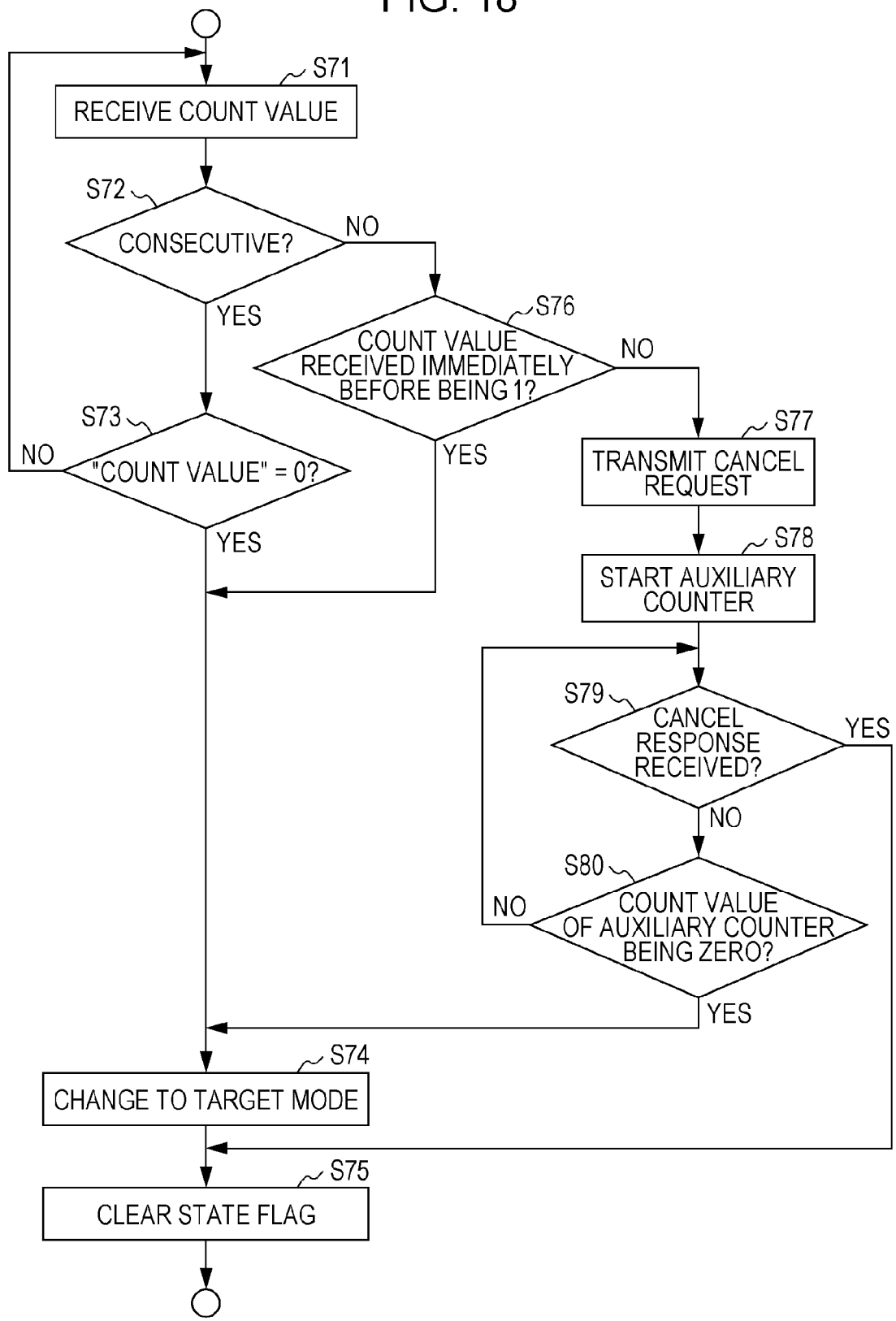
FIG. 18 is a flowchart illustrating a method of controlling the error correction using the consecutiveness of count values.

FIG. 18 is a flowchart of the error correction control method performed based on the consecutiveness of the count values. The process of the flowchart of FIG. 18 is performed instead of or in parallel with S37 through S40 of FIG. 10.

In S71, the error correction controller 60 receives the count value transmitted from the partner transmission apparatus. The error correction controller 60 has a record of the previously received count values. The error correction controller 60 here has a record of at least the count value received immediately before.

In S72, the error correction controller 60 checks the consecutiveness of the count values successively received from the partner transmission apparatus. The error correction controller 60 determines whether a difference between the count value received immediately before and the next received count value is one. If the received count values are consecutive, the error correction controller 60 performs operations in S73 through S75. S73 through S75 are substantially identical to S38 through S40. More specifically, if the count value is zero, the error correction mode is changed to the target mode, and the stage flag module 84 is cleared.

If the received count values are not consecutive (no in S72), the error correction controller 60 determines in S76 whether the count value received immediately before is "1." If the count value received immediately before is "1," the error correction controller 60 changes the error correction mode through S74 through S75.

If the count value received immediately before is not "1," the error correction controller 60 generates and transmits the cancel request to the partner transmission apparatus in S77. In S78, the error correction controller 60 starts up the auxiliary counter. As described above, the initial value of the auxiliary counter is a value smaller than the count value received immediately before by one. The auxiliary counter downcounts the count value thereof in synchronization with the transmission of the count value from the partner transmission apparatus.

In S79 through S80, the error correction controller 60 receives the cancel response and monitors the auxiliary counter. If the cancel response is received from the partner transmission apparatus before the count value of the auxiliary counter reaches zero, the error correction controller 60 updates the stage flag module 84 from "1" to "0" without changing the error correction mode. Also, the error correction controller 60 ends the changing process without changing the error correction mode. If the count value of the auxiliary counter reaches zero before the cancel response is received from the partner transmission apparatus, the error correction controller 60 changes the error correction mode to the target mode in S74, and then updates the stage flag module 84.

Upon receiving "the count value=2" subsequent to the "count value=6," in the example of the embodiment of FIG. 15, the transmission apparatus 20 transmits the cancel request in S77, and starts up the auxiliary counter in S78. The transmission apparatus 20 then receives the cancel response from the transmission apparatus 10 before the count value of the auxiliary counter reaches zero. The determination in S79 is thus "yes," and the transmission apparatus 20 does not change the error correction mode.

In the same manner as in the example of the embodiment of FIG. 15, the transmission apparatus 20 transmits the cancel request in S77, and starts the auxiliary counter in S78 as illustrated in FIG. 16. The count value of the auxiliary counter becomes zero before the transmission apparatus 20 receives the cancel response from the transmission apparatus 10. The determination in S80 is "yes," and the transmission apparatus 20 changes the error correction mode.

In the example of the embodiment of FIG. 17, the transmission apparatus 20 receives "the count value=4" subsequent to "the count value=1." The determination in S76 is "yes." The transmission apparatus 20 changes the error correction mode in S74 without transmitting the cancel request.

Upon receiving the mode change request in the error correction control method of the embodiment, the transmitter side apparatus generates the change timing values in the specific order with the specific period according to the specific rule and then transmits the changing timing values to the receiver side apparatus. Upon receiving the mode change request in the example of the embodiment, the transmission apparatus 10 successively generates with the specific period the count values that are decremented by one at a time, and then transmits the count values to the transmission apparatus 20. If the change timing values successively received from the transmitter side apparatus are out of the specific rule, the receiver side apparatus changes the error correction mode at the timing when the change timing value, determined by the change timing value received in the past and according to the specific rule, and received from the transmitter side apparatus, becomes a specific value. If the transmission apparatus 20 detects a nonconsecutiveness in the count values successively received from the transmission apparatus 10 in the example of the embodiment, the transmission apparatus 20 determines or estimates, in accordance with the consecutiveness of the count values received in the past, a timing when the count value received from the transmission apparatus 10 is expected to become zero. The transmission apparatus 20 then changes the error correction mode at the timing determined or estimated. Even if information specifying the change of the error correction mode which the transmission apparatus 10 notifies the transmission apparatus 20 of is not correctly conveyed because of a bit error or the like, the transmission apparatuses 10 and 20 may change the error correction mode in synchronization.

The reliability of the process using the consecutiveness of the count values is studied here. The discussion below is based on a communication environment where a 8-bit error is detected in each OTN frame through BIP8.

The arithmetic operation of BIP8 covers the OPU overhead and the OPU payload. More specifically, in BIP8, the arithmetic operation is performed on data of 15240 bytes. The count value is stored in an FTFL region and is then transmitted. If a 1 bit error is detected through the BIP8 operation, the probability that the count value is affected by that error is 1/15240. More specifically, the probability that the count value is affected by the error is 8/15240 in the communication environment where an 8 bit error is detected through BIP8. Since a part of bits of the FTFL region is used to transmit the count value in the example of the embodiment, the actual probability becomes lower than 8/15240.

If the count values successively received from the partner transmission apparatus are consecutive, the data of the FTFL region are considered to be correct. For example, if the two count values successively received from the partner transmission apparatus are consecutive, the error ratio of the FTFL is $(8/15240)^2$. The number of consecutive count values and the error ratio of the FTFL are listed in Table as below.

TABLE 1

| Number of consecutive count values | FTFL error ratio |
| --- | --- |
| 1 | 0.000524934 (8/15240) |
| 2 | 2.75556E−07 |
| 3 | 1.44649E−10 |
| 4 | 7.59312E−14 |
| 5 | 3.98589E−17 |

The lower limit threshold value of the error ratio of RS-FEC defined in ITU-T is $1 \times 10^{-15}$. If the five count values are consecutive, the error ratio of the FTFL region becomes lower than the lower limit threshold value. In other words, if the five or more count values successively received are consecutive, the error ratio of the FTFL region is considered to be sufficiently small. As illustrated in FIG. 17, the count values received by the transmission apparatus 20 are consecutive in a period from the initial value to "1." Let 5 be the initial value here. The five count values are consecutive, and the error ratio of the FTFL is considered to be sufficiently small. An initial value of 5 or higher is desirable as a value set to be in the counter module 71.

If a refraction index of an optical fiber is 1.5, a transmission delay between the transmission apparatuses is about 0.004280822 frame/km in OTU4. More specifically, if the transmission distance is 1000 km, the transmission delay may be about 4 frames. In the error correction control method of the embodiment, the count value is updated and transmitted every 512 frames. In a transmission system with a transmission distance of 1000 km, the effect of the transmission delay on the count value is about 0.008. The effect of the transmission delay is negligible when the initial value to be set in the counter module 71 is calculated. It is noted that the effect of the transmission delay on the count value is even smaller in OTU1 through OTU3.

The example of the embodiment described above employs the counter. A change timing value complying with a rule and recognizable by the transmitter side and the receiver side may be used. For example, the change timing values may not necessarily be the consecutive count values. The change timing values may be a series of odd numbers such as 1, 3, 5, and 7. As long as the transmitter side and the receiver side recognize, a combination of any numbers in a free order, for example, 2, 1, 5, 8, and 6 may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An error correction control method of a transmission system on in which a signal is transmitted from a first transmission apparatus to a second transmission apparatus, the error correction control method comprising:
    transmitting a signal for a mode change request to change an error correction mode from the second transmission apparatus to the first transmission apparatus;
    transmitting signals having a change timing value in a specific order with a specific period from the first transmission apparatus to the second transmission apparatus when the first transmission apparatus receives the mode change request;
    changing the error correction mode of the first transmission apparatus when the change timing value to be transmitted becomes a specific value in the first transmission apparatus;
    synchronizing the first and second transmission apparatuses, by changing the error correction mode of the second transmission apparatus in response to the change timing value received with the specific period from the first transmission apparatus.

2. The error correction control method according to claim 1, wherein the second transmission apparatus transmits the signal for the mode change request when an error correction ratio of received signals from the first transmission apparatus satisfies a specific condition.

3. The error correction control method according to claim 1, wherein the second transmission apparatus transmits the signal for the mode change request to the first transmission apparatus when an error ratio of received signals from the first transmission apparatus satisfies a specific condition on operation in a no-error-correction mode.

4. The error correction control method according to claim 1,
    wherein, when the first transmission apparatus receives the mode change request, the first transmission apparatus sequentially generates the change timing value with the specific period in accordance with a specific rule and then sequentially transmits the generated change timing value to the second transmission apparatus,
    wherein, when the change timing value sequentially received from the first transmission apparatus conforms with the specific rule and becomes the specific value, the second transmission apparatus changes the error correction mode thereof, and
    wherein, when the change timing value sequentially received from the first transmission apparatus nonconforms the specific rule, the second transmission apparatus changes the error correction mode thereof at a timing when the change timing value, determined in accordance with the specific rule and the change timing values hitherto received by the second transmission apparatus, becomes the specific value.

5. The error correction control method according to claim 1,
    wherein the first transmission apparatus changes the error correction mode thereof to a target mode specified by the mode change request when the change timing value to be transmitted becomes the specific value in the first transmission apparatus, and
    wherein the second transmission apparatus changes the error correction mode thereof to the target mode in accordance with the change timing value received with the specific period from the first transmission apparatus.

6. The error correction control method according to claim 1, wherein the change timing value is a count value that results from modifying a count value of a counter with the specific period.

7. The error correction control method according to claim 6,
    wherein the first transmission apparatus modifies the count value of the counter therein by one at a time with the specific period, starting with a specific initial value when the first transmission apparatus receives the mode change request,
    wherein the first transmission apparatus transmits the count value to the second transmission apparatus when the count value is modified,
    wherein the second transmission apparatus transmits a signal for a cancel request to cancel the mode change request to the first transmission apparatus when count values successively received from the first transmission apparatus are nonconsecutive, and
    wherein the first transmission apparatus stops the counting of the counter therein when the first transmission apparatus receives the cancel request before the count value reaches the specific value.

8. The error correction control method according to claim 7, wherein the second transmission apparatus changes the error correction mode thereof, when a response to the cancel request is not received at the second transmission apparatus from the first transmission apparatus before a timing when the count value, determined in accordance with consecutiveness of the count values prior to a detection of the nonconsecutiveness, and received from the first transmission apparatus, becomes the specific value.

9. The error correction control method according to claim 6,
    wherein the first transmission apparatus modifies the count value of the counter therein by one at a time with the specific period, starting with a specific initial value when the first transmission apparatus receives the mode change request,
    wherein the first transmission apparatus transmits the count value to the second transmission apparatus when the first transmission apparatus modifies the count value, and
    wherein the second transmission apparatus changes the error correction mode thereof at a timing when the count value, determined in accordance with consecutiveness of the count values, and received from the first transmission apparatus, becomes the specific value.

10. The error correction control method according to claim 6,
    wherein the second transmission apparatus transmits the mode change request to the first transmission apparatus when one of an error correction ratio and an error ratio of the received signal from the first transmission apparatus becomes higher than a specific value, wherein the second transmission apparatus transmits a signal for a cancel request to cancel the mode change request to the first transmission apparatus when one of the error correction ratio and the error ratio of the signal received from the first transmission apparatus becomes lower than the specific value after the mode change request is transmitted, and wherein the first transmission apparatus stops the counting of the counter therein when the cancel request is received before the count value reaches the specific value.

11. The error correction control method according to claim 6, wherein the second transmission apparatus transmits the mode change request to the first transmission apparatus when one of an error correction ratio and an error ratio of the received signal from the first transmission apparatus becomes lower than a specific value, wherein the second transmission apparatus transmits a signal for a cancel request to cancel the mode change request to the first transmission apparatus when one of the error correction ratio and the error ratio of the signal received from the first transmission apparatus becomes higher than the specific value after the mode change request is transmitted, and wherein the first transmission apparatus stops the counting of the counter therein when the cancel request is received before the count value reaches the specific value.

12. The error correction control method according to claim 6, wherein the first transmission apparatus transmits the count value to the second transmission apparatus by using an overhead area arranged in a frame signal including data to be transmitted from the first transmission apparatus to the second transmission apparatus.

13. The error correction control method according to claim 12, wherein the first transmission apparatus transmits the count value to the second transmission apparatus by using the overhead area in a multi-frame signal.

14. A transmission system comprising:
a first transmission apparatus to transmit a signal; and
a second transmission apparatus to receive the signal transmitted from the first transmission apparatus, and transmit to the first transmission apparatus a signal for a mode change request to change an error correction mode,
wherein the first transmission apparatus transmits signals having a change timing value in a specific order with a specific period to the second transmission apparatus when the first transmission apparatus receives the mode change request, and changes the error correction mode thereof when the change timing value to be transmitted becomes a specific value in the first transmission apparatus, and
wherein the first transmission apparatus and the second transmission apparatus are synchronized by changing the error correction mode of the second transmission apparatus in response to the change timing value received with the specific period from the first transmission apparatus.

15. The transmission system according to claim 14,
wherein the first transmission apparatus includes:
an error corrector to process the signal to be transmitted to the second transmission apparatus through an error correction mode specified among a plurality of error correction modes, and
an error correction controller, so as to specify the error correction mode to be used by the error corrector, configured to:
transmit to the second transmission apparatus a change timing value in a specific order with a specific period as information indicating a timing when the second transmission apparatus is to change the error correction mode, when a signal for a mode change request is received from the second transmission apparatus, and
change the error correction mode when the change timing value is a specific value.

16. The transmission system according to claim 14,
wherein the second transmission apparatus includes:
an error corrector to process the received signal through an error correction mode specified from among a plurality of error correction modes; and
an error correction controller, so as to specify the error correction mode to be used by the error corrector, configured to:
transmit to the first transmission apparatus a signal for a mode change request to change the error correction mode when one of an error correction ratio and an error ratio of the received signal satisfies a specific condition,
receive a change timing value transmitted in a specific order with a specific period from the first transmission apparatus in response to the mode change request, and
change the error correction mode to be used by the error corrector in accordance with the change timing value received with the specific period from the first transmission apparatus.

* * * * *